(12) United States Patent
Tsutsui et al.

(10) Patent No.: US 6,636,114 B2
(45) Date of Patent: Oct. 21, 2003

(54) HIGH FREQUENCY POWER AMPLIFIER MODULE AND WIRELESS COMMUNICATION APPARATUS

(75) Inventors: Takayuki Tsutsui, Saku (JP); Tetsuaki Adachi, Chiisagata (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/938,547

(22) Filed: Aug. 27, 2001

(65) Prior Publication Data

US 2002/0030541 A1 Mar. 14, 2002

(30) Foreign Application Priority Data

Sep. 11, 2000 (JP) ........................................ 2000-275605

(51) Int. Cl.[7] ................................................. H03F 1/14
(52) U.S. Cl. .................... 330/51; 330/129; 330/133; 330/134; 330/285; 330/289
(58) Field of Search ........................ 330/51, 129, 133, 330/134, 285, 289

(56) References Cited

U.S. PATENT DOCUMENTS

| | | | | |
|---|---|---|---|---|
| 5,661,434 A | * | 8/1997 | Brozovich et al. | ............. 330/51 |
| 5,774,017 A | * | 6/1998 | Adar | ........................... 330/51 |
| 5,880,631 A | * | 3/1999 | Sahota | ......................... 330/51 |
| 6,384,686 B2 | * | 5/2002 | Ueno et al. | .................. 330/285 |
| 6,433,639 B1 | * | 8/2002 | Numanami et al. | ......... 330/277 |

OTHER PUBLICATIONS

"The wireless circuit holds the key to the on–chip cellular telephone," Nikkei Electronics (No. 773), Jul. 3, 2000, pp. 126–131.

"Circuit system innovation accelerates cost reduction and downsizing," Nikkei Electronics (No. 773), Jul. 3, 2000, pp. 132–139.

"Mobile communication services are increasing in speed around the world," Nikkei Electronics (No. 757), Nov. 15, 1999, p. 131.

Goldberg, Lee. "RF power amplifier IC serves to extend options at output stage of cellular phone," Nikkei Electronics (No. 681), Jan. 27, 1997, pp. 115–126.

Endo, T. et al. "A high–frequency analog signal processing IC for the 'GSM/EGSM' digital cellular standards," Hitachi Review (vol. 79), Nov. 1997, pp. 63–68.

* cited by examiner

*Primary Examiner*—Michael Tokar
*Assistant Examiner*—Linh Van Nguyen
(74) *Attorney, Agent, or Firm*—Miles & Stockbridge P.C.

(57) ABSTRACT

A GSM system and an EDGE system much different in gain are incorporated into a single high frequency power amplifier module.

In a high frequency power amplifier module having a multi-stage amplifying configuration, which is used in a GSM mode and an EDGE mode according to switching, a first-stage amplifier comprises a dual gate MOSFET. In the EDGE mode, an APC signal or a selected and fixed potential is supplied to a first gate electrode of the dual gate MOSFET. Further, Vgs (Vgs1, Vgs2 and Vgs3) of respective transistors of from a first stage to a third stage are fixed in potential form or supplied as APC signals, and the gain in the EDGE mode is matched with that in the GSM mode, whereby the generation of noise is reduced.

37 Claims, 16 Drawing Sheets

Pin ASSIGNMENT

1 : Vcgs-GSM900
2 : N/C
3 : Pout-GSM900
4 : Vdd-GSM900
5 : Vdd-GSM1800
6 : Pout-GSM1800
7 : mode-SW
8 : Vcgs-GSM1800
9 : Pin-GSM1800
10 : Vapc-GSM1800
11 : Vapc-GSM900
12 : Pin-GSM900
G : GND

FIG. 17

| RESPECTIVE BIAS | BIAS CONFIGURATION EXAMPLE OF THE PRESENT INVENTION | | | | BIAS CONFIGURATION EXAMPLE OF DISCUSSED CIRCUIT | |
|---|---|---|---|---|---|---|
| | GSM MODE | EDGE MODE 1 | EDGE MODE 2 | EDGE MODE 3 | GSM MODE | EDGE MODE |
| Vcgs | APC | SELECT AND FIX | APC | APC | APC | FIX |
| Vgs1 | APC, FIX | FIX | FIX | APC | APC | FIX |
| Vgs2 | APC | FIX | FIX | APC | APC | FIX |
| Vgs3 | APC | FIX | FIX | APC | APC | FIX |
| Pin | FIX | AGC | FIX | FIX | FIX | AGC |
| AGC | UNNECESSARY | NECESSARY | UNNECESSARY | UNNECESSARY | UNNECESSARY | NECESSARY |

(DIRECT CONVERSION)

(OFFSET PLL)

HIGH FREQUENCY POWER AMPLIFIER MODULE AND WIRELESS COMMUNICATION APPARATUS

BACKGROUND OF THE INVENTION

The present invention relates to a high frequency power amplifier module having a plurality of amplifying systems, for example, a high frequency power amplifier device (high frequency power amplifier module) capable of performing linear amplification and non-linear amplification (saturation amplification) and a wireless communication apparatus in which the high frequency power amplifier module is built therein, and particularly to a technology effective for application to a cellular portable phone of a multi-mode and multi-band communication scheme or system, which has a plurality of communication functions different from one another in communication mode and frequency band.

In a North American cellular market, a single cellular phone, a so-called dual mode portable phone has recently been used wherein a digital system such as an analog type AMPS (Advanced Mobile Phone Service) covering the whole of North America, which has heretofore been used, TDMA (Time Division Multiple Access), CDMA (Code Division Multiple Access) or the like is built therein.

On the other hand, a GSM (Global System for Mobile Communication) system using a TDMA technology and an FDD (Frequency Division Duplex) technology has been used in Europe or the like. An EDGE (Enhanced Data Rates for GSM Evolution) system has been developed as a communication system in which a transfer rate can be made high in the GSM system.

The EDGE has been described in "Nikkei Electronics" published by Nikkei Business Publications, Inc., the Nov. 15, 1999 (no.757), P131, and the Jul. 3, 2000 (no.773), P126 to P139 of the same issue.

The former reference has described a speeded-up mobile communication service in various parts of the world. The present reference describes that the mobile communication service transitions from the second generation of ~9.6 kbits/second to the third generation of ~2 Mbits/second. Further, the reference describes that in Europe, the mobile communication service transitions to an EDGE (third generation) through a GPRS (General Packet Radio Service: 2.5th generation) corresponding to a data communication service based on packet communications in which the existing GSM network is expanded, whereas in the USA, the mobile communication service transitions from an IS-136 system (TDMA) to the EDGE and from an IS-95 system (CDMA) to a cdma2000, an IS-2000 and an HDR (High Data Rate).

The latter reference describes a size reduction in a wireless circuit of a cellular phone. Further, the reference describes that a control technology wherein a plurality of channels can simultaneously be used in a high-speed data transmission or communication service, has been developed, and also describes that in a system EDGE dedicated for a GSM-based data communication service, a modulation scheme is changed from GMSK to eight-phase PSK to increase frequency availability, thereby implementing 384 kbits/second. Furthermore, the same reference discloses a reference board for a GSM cellular phone using a chip set of a superheterodyne system and a direct conversion system.

On the other hand, a multi-mode communication made by a dual mode cellular phone or the like has been described in "Nikkei Electronics" published by Nikkei Business Publications, Inc., the Jan. 27, 1997 (no.681), P115 to P126, and "Hitachi Review" published by Hitachi Review Inc., the November 1997 issue, Vol. 79, P63 to P68. The latter reference discloses an offset PLL (Phase-Locked Loop) method or system for the conversion of a transmit frequency on the transmitting side.

SUMMARY OF THE INVENTION

While lots of wireless data communications using mobile radio have heretofore been carried out at a transmission rate of 9.6 kbps, accessing to an Internet and corporate databases needs to have a higher transmission rate and hence a communication system corresponding to it has been required. While the GSM system furnishing services with Europe and Asia as principal parts, provides 9.6 kbps-based services under the present situation, an EDGE system in which a transmission rate has been set high, has been developed to meet the above request. Introducing this type of system makes it possible to increase the data transmission rate to 384 kbps and transmit data equivalent to 40 times per unit time to the GSM system.

Another advantage of the EDGE system resides in that since the EDGE system can be introduced by appropriating the basic system of GSM and partly changing a radio modulation system or scheme, it can be operated without introducing infrastructure. This would be attractive for many communication common carriers.

The modulation scheme to be changed serves as a system in which $3\pi/8$-rotating8PSK (Phase Shift Keying) modulation is used in the EDGE system with respect to GMSK (Gaussian Minimum Shift Keying) modulation of the GSM system. Thus, a signal transmission unit of a wiring apparatus needs to have higher linearity.

Since the EDGE system is a system in which the GSM system has been upbuilt, it is desirable that a single cellular phone is capable of making phone calls through the use of the GSM system and the EDGE system. It is therefore necessary to incorporate an amplifier for the GSM system and an amplifier for the EDGE system in the cellular phone.

The present inventors have discussed a high frequency power amplifier module wherein one amplifier circuit copes with the GSM system and the EDGE system. As a result, the present inventors have found the following problems to be solved.

(1) When the high frequency power amplifier module is used in GSM, the corresponding transistor is used in a saturated operation and hence a large output is required. Namely, an output power of about 36 dBm at maximum is necessary for a GMSK-modulated input signal of about 0 dBm, for example.

(2) When it is used in EDGE, the transistor is used in a linear operation and hence linearity is required for it. Namely, an output signal needs to be undistorted with respect to a $3\pi/8$-rotating 8PSK-modulated input signal. The maximum of linear output power ranges from about 28 dBm to about 29 dBm.

(3) In the GSM system and the EDGE system, a large difference occurs in their output power as described above as in the case where the maximum power ranges from 6 dBm to 8 dBm, and they differ in amplification class (Class A and Class C). Therefore, when the single amplifier is shared therebetween, lots of noise are produced and controllability becomes low due to the difference in gain therebetween.

An object of the present invention is to provide a high frequency power amplifier module and a wireless communication apparatus, which are capable of causing a saturation-operated system and a linearly-operated system to coexist with each other within the same circuit.

Another object of the present invention is to provide a high frequency power amplifier module and a wireless communication apparatus, which allow a GSM system (saturation operation) and an EDGE system (linear operation) to coexist with each other within the same circuit.

A further object of the present invention is to provide a high frequency power amplifier module and a wireless communication apparatus, which have plural modes/plural bands configurations.

The above, other objects and novel features of the present invention will become apparent from the description of the present specification and the accompanying drawings.

Summaries of typical ones of the inventions disclosed in the present application will be described in brief as follows:

(1) There is provided a high frequency power amplifier module comprising:

an input terminal supplied with a signal to be amplified;
an output terminal;
a control terminal;
a mode switch terminal;
a plurality of amplifying stages cascade-connected between the input terminal and the output terminal,
the plurality of amplifying stages respectively comprising first terminals each of which receives a signal inputted to each amplifying stage, second terminals each of which transmits a signal outputted therefrom, and third terminals each of which receives a reference potential for each amplifying stage;
bias circuits which are respectively connected between the control terminal and the first terminals of the respective amplifying stages and respectively apply to the first terminals a dc bias potential based on a voltage supplied to the control terminal;
a plurality of temperature characteristic compensating circuits which respectively constitute current mirror circuits with respect to the respective amplifying stages; and
a mode switching circuit which is operated by a signal supplied to the mode switching terminal and turns on and off each temperature characteristic compensating circuit to thereby perform switching between communication modes,
wherein the one or more amplifying stages excluding the amplifying stage corresponding to a final stage, of the plurality of amplifying stages, and the temperature characteristic compensating circuits corresponding to the one or more amplifying stages respectively comprise load-side semiconductor amplifying elements and ground-side semiconductor amplifying elements connected in series, control terminals of the load-side semiconductor amplifying elements of the amplifying stages and control terminals of the load-side semiconductor amplifying elements of the temperature characteristic compensating circuits corresponding to the amplifying stages are respectively connected to one another, and each of control terminals of the ground-side semiconductor amplifying elements of the amplifying stages is connected between resistors forming a voltage dividing resistor of each of the bias circuits for the amplifying stages,
a selected and fixed potential is applied to the control terminal of the load-side semiconductor amplifying element of each amplifying stage in one communication mode (EDGE mode) so that the communication modes different from each other approximate each other in gain, and
predetermined fixed potentials are respectively applied to the first terminals of the respective amplifying stages as bias potentials.

The high frequency power amplifier module is switched to either a phase-modulation circuit configuration (circuit configuration for a saturation amplifier, e.g., circuit configuration for GSM) or a phase and amplitude-modulation circuit configuration (circuit configuration for a linear amplifier, e.g., circuit configuration for EDGE) according to the operation of the mode switching circuit. The load-side semiconductor amplifying elements and the ground-side semiconductor amplifying elements are dual gate type semiconductor amplifying elements.

As a specific configuration, the plurality of amplifying stages, the bias circuits and the temperature characteristic compensating circuits incidental thereon, and the mode switch terminal are provided in plural form to thereby constitute a plurality of amplifying systems. The respective amplifying stages are connected to such mode switching terminals to constitute a multi-mode and multi-band high frequency power amplifier device or module.

For example, the high frequency power amplifier module takes a dual-band configuration having two amplifying systems. Each of the amplifying systems is formed as a dual-mode configuration corresponding to the configuration described in the above (1). Thus, the high frequency power amplifier module comprises a GSM900, a GSM1800 and an EDGE operated according to switching. External electrode terminals of the high frequency power amplifier module include input terminals (Pin-GSM900 and Pin-GSM1800), output terminals (Pout-GSM900 and Pout-GSM1800), control terminals (Vapc-GSM900 and Vapc-GSM1800), first reference potentials (Vdd-GSM900 and Vdd-GSM1800), a second reference potential (GND), first terminals (Vcgs-GSM900 and Vcgs-GSM1800) of load-side semiconductor amplifying elements, and a mode switching terminal (mode-SW).

Such a high frequency power amplifier module is incorporated in a transmission system of a wireless communication apparatus.

(2) In an EDGE mode under the configuration described in the above (1), an APC (automatic output control) signal is applied to each of the control terminals of the load-side semiconductor amplifying elements of the amplifying stages, and predetermined fixed potentials are respectively applied to the first terminals of the respective amplifying stages as bias potentials.

Such a high frequency power amplifier module is incorporated in a wireless communication apparatus as a direct conversion method or system or an offset PLL method or system. In the offset PLL method, the high frequency power amplifier module directly inputs an amplitude-modulated signal to its corresponding first gate of a dual gate transistor of a first-stage amplifying stage and directly inputs a phase signal to its corresponding second gate thereof.

(3) In the EDGE mode under the configuration described in the above (1), an APC signal is applied to each of the control terminals of the load-side semiconductor amplifying elements of the amplifying stages, and APC signals are respectively applied to the first terminals of the respective amplifying stages as bias potentials.

(4) There is provided a high frequency power amplifier module for performing a linear amplifying operation or a non-linear amplifying operation according to a communication mode signal, comprising:

an input terminal supplied with a signal to be amplified;

an output terminal;

a mode switch terminal;

a plurality of amplifying stages cascade-connected between the input terminal and the output terminal and having first terminals for respectively receiving input signals supplied to the amplifying stages, and second terminals for respectively sending out signals outputted from the amplifying stages;

bias circuits which are respectively connected to the first terminals of the respective amplifying stages and apply bias potentials to the first terminals; and a mode switching circuit which forms a mode signal according to a communication mode signal supplied to the mode switch terminal;

wherein at least one amplifying stage of the plurality of amplifying stages includes first and second semiconductor amplifying elements series-connected to one another, the first terminal of the amplifying stage is connected to a control input node of the second semiconductor amplifying element, and the second terminal thereof is connected to an output node of the first semiconductor amplifying element, the mode signal is supplied to the control input node of the first semiconductor amplifying element, and when the linear amplifying operation and the non-linear amplifying operation are performed, gain is controlled by the mode signal.

(5) There is provided a high frequency power amplifier module comprising:

an input terminal supplied with a signal to be amplified;

an output terminal;

a mode terminal;

a plurality of amplifying stages cascade-connected between the input terminal and the output terminal and having first terminals for respectively receiving input signals supplied to the amplifying stages, and second terminals for respectively sending out signals outputted from the amplifying stages;

bias circuits which supply bias potentials to the respective amplifying stages respectively; and a mode circuit which forms an AGC signal according to a signal supplied to the mode terminal;

wherein at least one of the amplifying stages has first and second semiconductor amplifying elements series-connected to one another, and a control terminal of the first semiconductor amplifying element is supplied with the AGC signal, an output terminal of the first semiconductor amplifying element is connected to the corresponding second terminal, and a control terminal of the second semiconductor amplifying element is connected to the corresponding first terminal.

(6) There is provided a high frequency power amplifier module comprising:

an input terminal supplied with a signal to be amplified;

an output terminal;

a mode terminal;

a plurality of amplifying stages cascade-connected between the input terminal and the output terminal and having first terminals for respectively receiving input signals supplied to the amplifying stages, and second terminals for respectively sending out signals outputted from the amplifying stages;

bias circuits which supply bias potentials to the respective amplifying stages respectively; and a mode circuit which forms an APC signal according to a signal supplied to the mode terminal;

wherein at least one of the amplifying stages has first and second semiconductor amplifying elements series-connected to one another, and a control terminal of the first semiconductor amplifying element is supplied with the APC signal, a control terminal of the second semiconductor amplifying element is connected to the corresponding first terminal and an output terminal of the first semiconductor amplifying element is connected to the corresponding second terminal.

According to the means described in the above (1), (a) in an EDGE mode, a selected and determined fixed potential is applied to each of the control terminals of the load-side semiconductor amplifying elements of the amplifying stages, an AGC signal is inputted to the input terminal, and potentials between the first terminals and third terminals of the respective amplifying stages are respectively fixed to predetermined values, whereby the gain in the EDGE mode can be controlled or suppressed while an adjacent channel leakage power standard is being satisfied, and the gains in the communication modes (GSM mode and EDGE mode) different from each other can be rendered approximate, thereby allowing stable multi-mode communications.

(b) It is possible to maintain a GSM 0 dBm input (three-stage configuration) widely used in GSM/EDGE dual modes. It is not necessary to increase a VCO output or newly introduce a pre-amplifier.

According to the means described in the above (2), (a) in an EDGE mode, an APC signal is applied to each of the control terminals of the load-side semiconductor amplifying elements of the amplifying stages, a fixed predetermined signal is inputted to the input terminal, and potentials between the first terminals and third terminals of the respective amplifying stages are respectively fixed to predetermined values, whereby the gain in the EDGE mode can be controlled or suppressed while an adjacent channel leakage power standard is being satisfied, and the gains in the communication modes (GSM mode and EDGE mode) different from each other can be rendered approximate, thereby enabling stable multi-mode communications.

(b) A direct conversion method or system eliminates the need for an AGC circuit, and a reduction in the manufacturing cost of a wireless communication apparatus can be achieved owing to a reduction in the number of components.

(c) An offset PLL method or system eliminates the need for the AGC circuit, and a reduction in the manufacturing cost of a wireless communication apparatus can be achieved owing to a reduction in the number of components.

(d) In the offset PLL method, the high frequency power amplifier module has a mixer function and makes it unnecessary to provide a mixer as a discrete circuit. Thus, a reduction in the manufacturing cost of a wiring communication apparatus can be achieved owing to a reduction in the number of components.

According to the means described in the above (3), (a) in an EDGE mode, an APC signal is applied to each of the control terminals of the load-side semiconductor amplifying elements of the amplifying stages, a fixed predetermined signal is inputted to the input terminal, and potentials between the first terminals and third terminals of the respective amplifying stages are respectively controlled by APC signals, whereby the gain in the EDGE mode can be controlled or suppressed while an adjacent channel leakage power standard is being satisfied, and the gains in the communication modes (GSM mode and EDGE mode) different from each other can be rendered approximate, thereby enabling stable multi-mode communications.

BRIEF DESCRIPTION OF THE DRAWINGS

FIG. 17 is a partly block diagram depicting the function configurations of the wireless communication apparatuses according to the operation examples 1, 2 and 3;

DETAILED DESCRIPTION OF THE PREFERRED EMBODIMENTS

Figure 1:
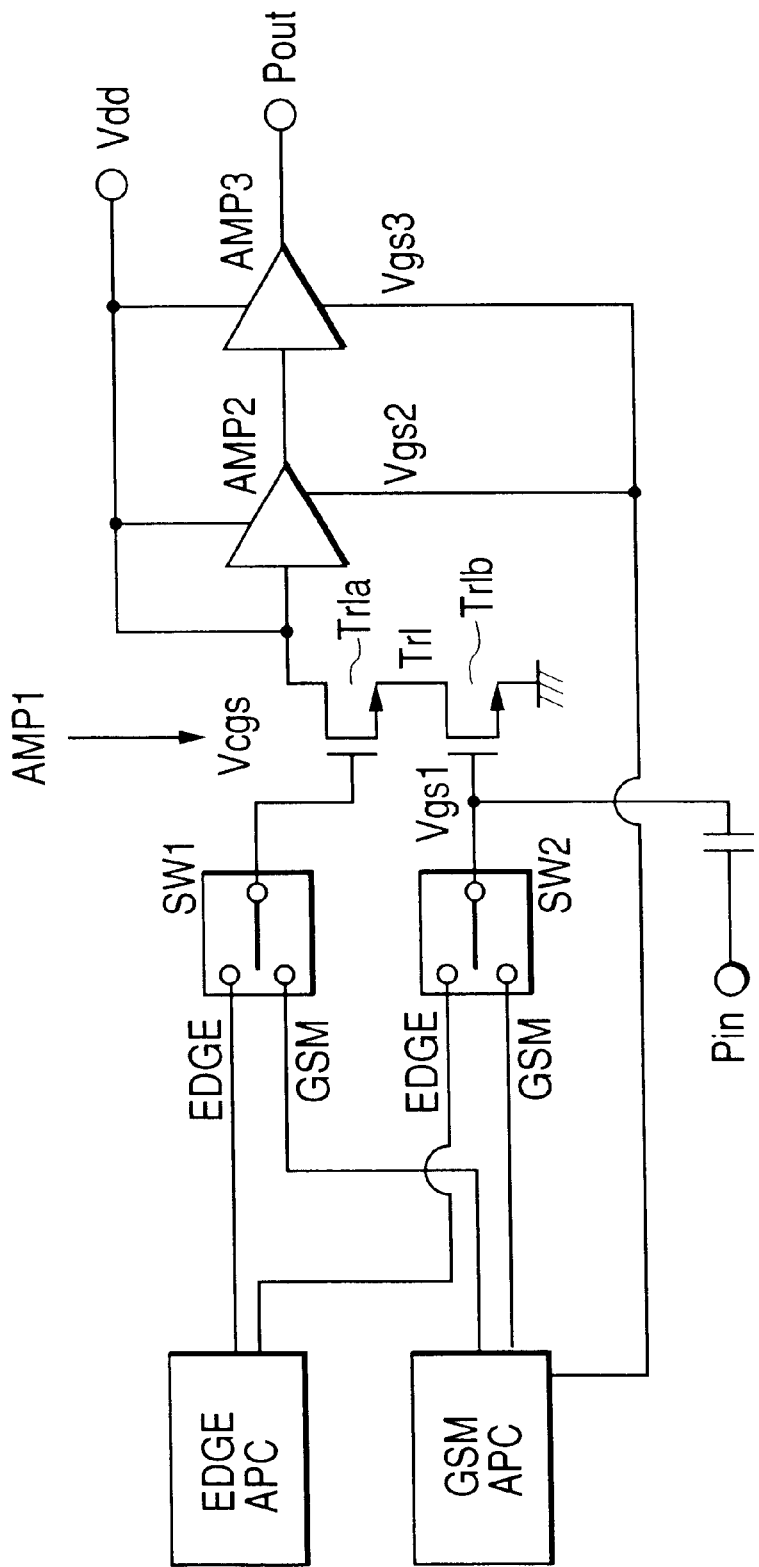
FIG. 1 is a block diagram showing a circuit configuration of a high frequency power amplifier module showing one embodiment (first embodiment) of the present invention.

Preferred embodiments of the present invention will hereinafter be described in detail with reference to the accompanying drawings. Incidentally, ones or elements each having the same function in all the drawings for describing the embodiments of the invention are respectively identified by the same reference numerals and their repetitive description will therefore be omitted.

(First Embodiment)

In a first embodiment, a description will be made of an example of a wireless communication apparatus (corresponding to a dualmode-dualband wireless communication apparatus) wherein a mode switching circuit is operated to perform switching to either a phase-modulation circuit configuration (circuit configuration for saturation amplification, e.g., circuit configuration for GSM) or a phase and amplitude-modulation circuit configuration (circuit configuration for linear amplification, e.g., circuit configuration for EDGE), whereby communications are carried out.

FIG. 1 is a typical diagram showing a circuit configuration of a high frequency power amplifier module for performing mode switching. As is understood from the present circuit diagram, the high frequency power amplifier module according to the first embodiment corresponds to a high frequency power amplifier module having a dualband-dualmode configuration, which is capable of amplifying a GSM900 and a GSM1800, and an EDGE900 and an EDGE1800 selected according to mode switching.

An amplification system takes a three-stage amplification configuration wherein amplifying stages (AMP1, AMP2 and AMP3) are successively cascade-connected. The amplifying stage (AMP1) corresponding to an initial or first stage is formed of semiconductor amplifying elements which comprise a load-side semiconductor amplifying element Tr1$a$ and a ground-side semiconductor amplifying element Tr1$b$ both connected in series. The Tr1 may be a dual-gate semiconductor amplifying element.

As the semiconductor amplifying elements, a MOS (Metal Oxide Semiconductor) FET, a silicon bipolar transistor, a GaAs-MES (Metal-Semiconductor) FET, an HBT (Hetero Junction Bipolar Transistor), an HEMT (High Electron Mobility Transistor), an Si—Ge transistor, etc. are used.

One of APC signals Corresponding to two types (GSM900 and GSM1800) transmitted from a GSMAPC is sent to one contact of a selector switch SW1, and the other thereof is transmitted to one contact of a selector switch SW2. Further, the two types of APC signals sent from the GSMAPC control Vgs2 and Vgs3 of the AMP2 and AMP3.

One of two types of EDGE signals (EDGE900 and EDGE1800) transmitted from an EDGEAPC is transmitted to the other contact of the selector switch SW1, and the other thereof is sent to the other contact of the selector switch SW2.

An output terminal of the selector switch SW1 is connected to a control terminal (gate electrode) of Tr1a corresponding to the load-side semiconductor amplifying element of the AMP1 so that Vcgs is controlled. Further, an output terminal of the selector switch SW2 is connected to a control terminal (gate electrode) of Tr1b corresponding to the ground-side semiconductor amplifying element of the AMP1 so that Vgs1 is controlled.

First terminals (drain electrodes) of the AMP1, AMP2 and AMP3 are respectively supplied with a first reference potential (Vdd). The control terminal (gate electrode) of the ground-side semiconductor amplifying element Tr1b of the AMP1 is supplied with an input signal. The output of the AMP3 is outputted to an output terminal Pout.

The circuit having such a configuration serves as a high frequency power amplifier module capable of reducing or suppressing linear gain of EDGE in the case of the EDGE, thereby making the gain of the GSM and that of the EDGE substantially identical to each other, and allowing GSM-base communications and EDGE-based communications, both of which are low in distortion and noise and stable.

A specific high frequency power amplifier module and a wireless communication apparatus with the high frequency power amplifier module built therein will next be explained.

Figure 2:
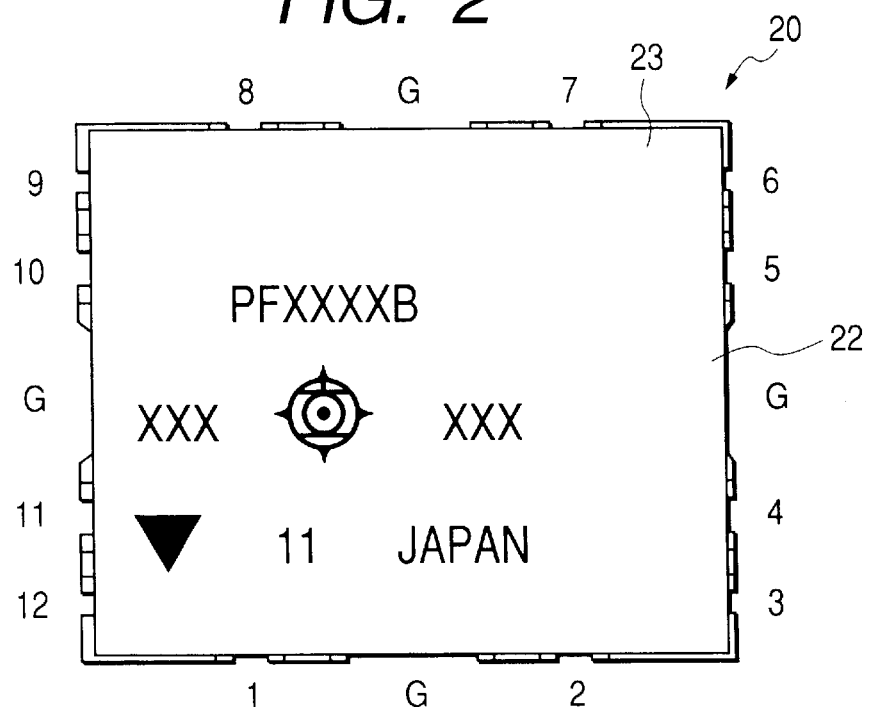
FIG. 2 is a plan view of the high frequency power amplifier module showing the first embodiment.
Figure 3:
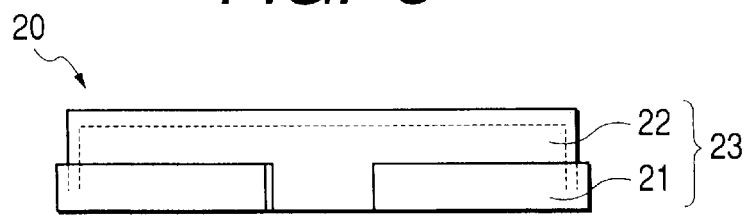
FIG. 3 is a side view of the high frequency power amplifier module illustrating the first embodiment.
Figure 4:
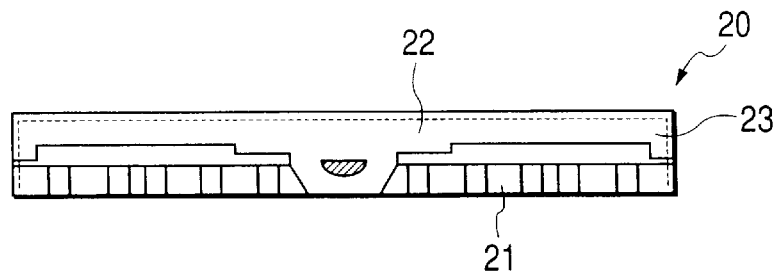
FIG. 4 is a front view of the high frequency power amplifier module depicting the first embodiment.
Figure 5:
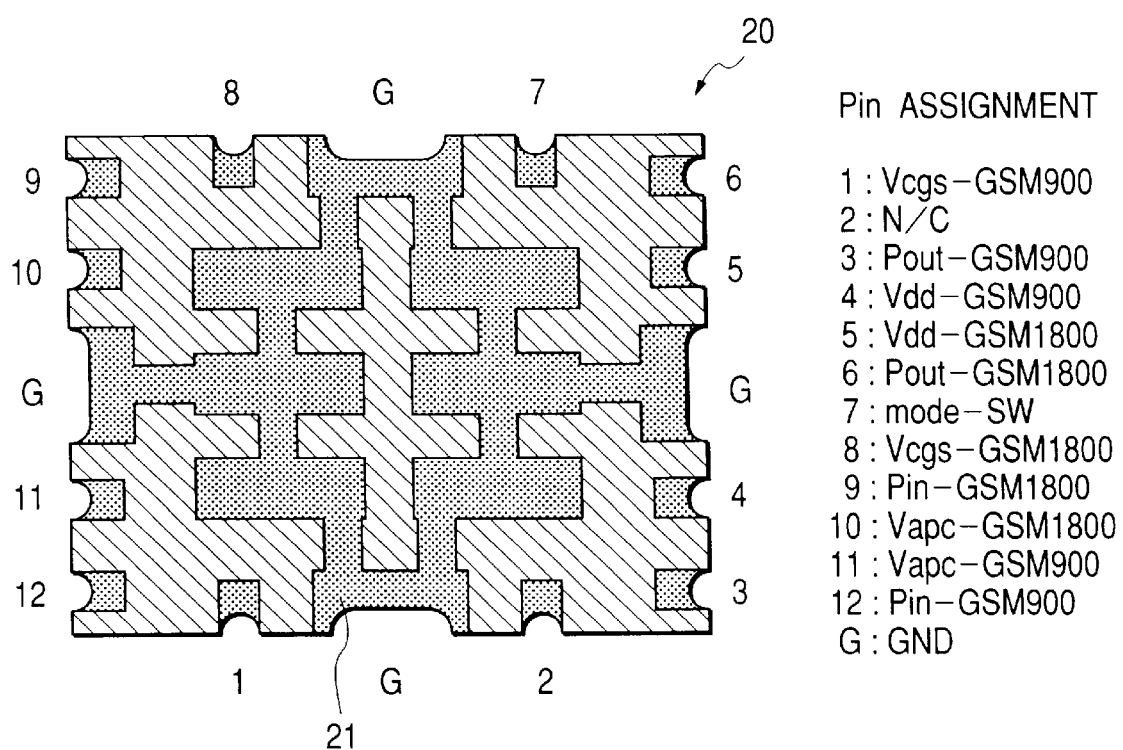
FIG. 5 is a typical plan view showing electrode patterns provided at the bottom face of the high frequency power amplifier module showing the first embodiment on a see-through basis.

As shown in a plan view of FIG. 2, a side view of FIG. 3, a front view of FIG. 4 and a typical plan view of FIG. 5 showing electrode patterns at the bottom face of the high frequency power amplifier module on a see-through basis, the high frequency power amplifier module 20 has a rectangular structure flat in outer appearance. The high frequency power amplifier module 20 has a structure wherein a package 23 having a flat rectangular structure is formed or configured by a module substrate 21 made up of a plate-like wiring board, and a cap 22 attached to one surface (main surface) of the module substrate 21. The cap 22 is made of a metal which plays the role of an electromagnetic shield effect. Wiring patterns for the wiring board 21 and electronic components including semiconductor amplifying elements placed on the wiring board 21 constitute such a circuit as shown in FIG. 6.

As shown in FIGS. 2 and 5, external electrode terminals are respectively provided over the peripheral surface of the high frequency power amplifier module 20 and the bottom face thereof. The external electrode terminals are of a surface-mount type and are formed of wirings formed on the module substrate 21 and solder formed on the surfaces thereof. Reference numeral 1 indicates a Vcgs-GSM 900 terminal, reference numeral 2 indicates a non-contact terminal (N/C), reference numeral 3 indicates a Pout-GSM900 terminal, reference numeral 4 indicates a Vdd-GSM900 terminal, reference numeral 5 indicates a Vdd-GSM1800 terminal, reference numeral 6 indicates a Pout-GSM1800 terminal, reference numeral 7 indicates a mode switch or switching terminal (mode-SW), reference numeral 8 indicates a Vcgs-GSM1800 terminal, reference numeral 9 indicates a Pin-GSM1800 terminal, reference numeral 10 indicates a Vapc-GSM1800 terminal, reference numeral 11 indicates a Vapc-GSM900 terminal, reference numeral 12 indicates a Pin-GSM900 terminal, and G indicates a GND terminal, respectively.

Figure 6:
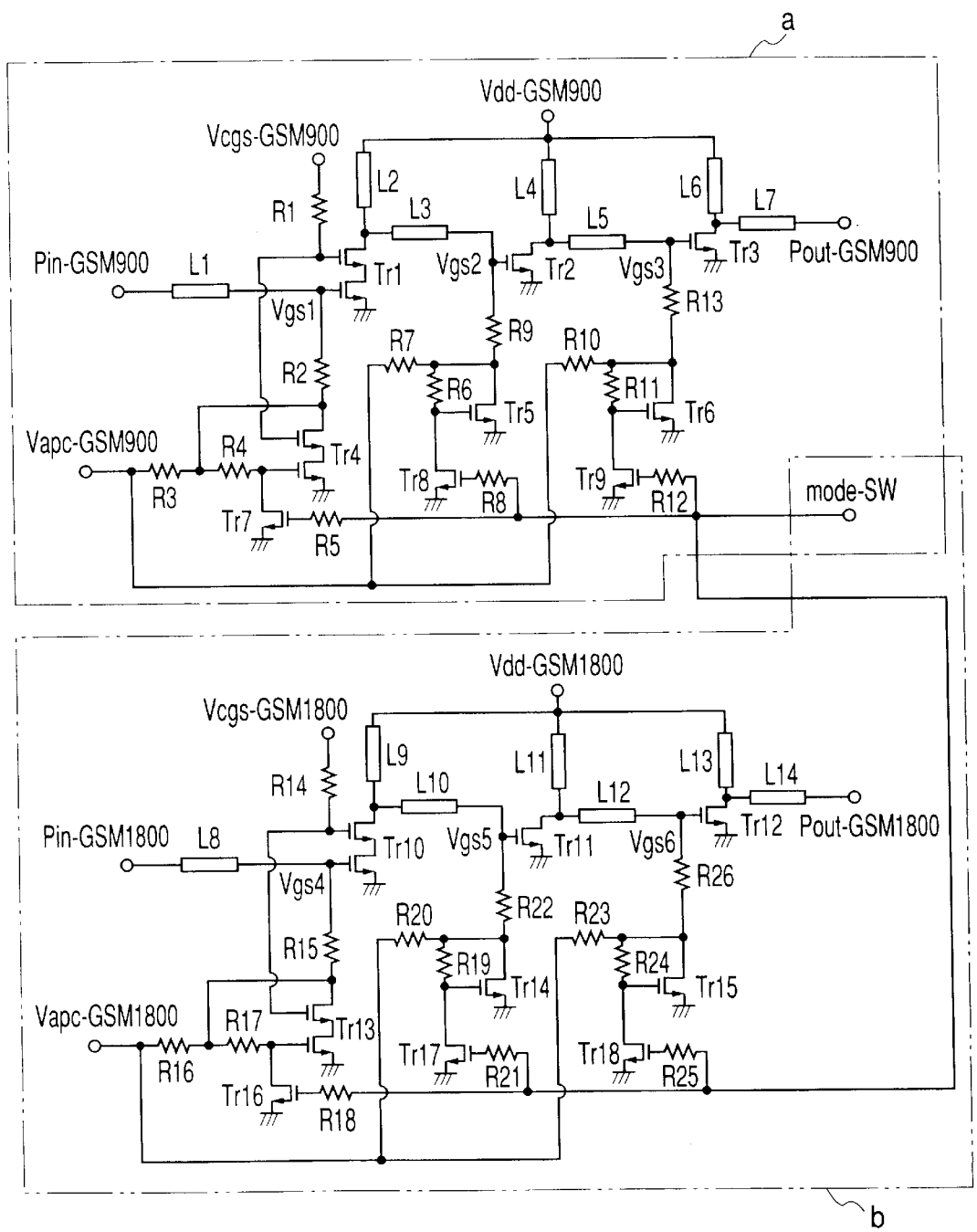
FIG. 6 is an equivalent circuit diagram of the high frequency power amplifier module illustrating the first embodiment.

FIG. 6 is an equivalent circuit diagram of the high frequency power amplifier module (corresponding to transmit RF signal amplifying power amplifier) showing the first embodiment. As shown in the equivalent circuit diagram, it has an amplifying system a for the GSM900, and an amplifying system b for the GSM1800. In the amplifying systems a and b, switching is performed between circuit configurations according to a signal sent from the mode switch terminal (mode-SW). Thus, the GSM900 results in the EDGE900 and the GSM1800 results in the EDGE1800.

While the amplifying system a and the amplifying system b are different from each other in terms of the performance of the electronic components employed therein but are identical in circuit configuration. Accordingly, symbols applied to parts or components of the amplifying system b corresponding to the amplifying system a are shown inside the parentheses in the description of the amplifying system a, and this will be defined as the description of the amplifying system b.

The external electrode terminals in the amplifying system a include a Pin-GSM900 (Pin-GSM1800 in the amplifying system b) used as an input terminal, a Pout-GSM900 (Pout-GSM1800 in the amplifying system b) used as an output terminal, a Vdd-GSM900 (Vdd-GSM1800 in the amplifying system b), a Vcgs-GSM900 (Vcgs-GSM1800 in the amplifying system b), a Vapc-GSM900 (Vapc-GSM1800 in the amplifying system b), a mode switch terminal (mode-SW) used in common, and a GND terminal.

Amplifying stages corresponding to three stages are cascade-connected between the Pin-GSM900 (Pin-GSM1800) and Pout-GSM900 (Pout-GSM1800). Each of the first stages comprises a dual gate MOSFET (Tr1: TR10 in the amplifying system b), and the second and third stages (output stages) respectively comprise single-gate MOSFETs (Tr2 and Tr3: TR11 and Tr12 in the amplifying system b).

The first stages may respectively comprise load-side semiconductor amplifying elements and ground-side semiconductor amplifying elements connected in series, in place of the dual gate MOSFETs. Incidentally, load-side transistors and ground-side transistors of the dual gate MOSFETs will be explained without being marked with symbols in particular in the circuit configuration shown in FIG. 6. Control terminals of the load-side transistors will be called "first gate electrodes", and control terminals of the ground-side transistors will be called "second gate electrodes". The respective transistors, which constitute the respective amplifying stages, respectively comprise first terminals (gate electrodes) for receiving input signals to the amplifying stages, and second terminals (drain electrodes) for transmitting output signals of the amplifying stages, and third terminals (source electrodes) for receiving a reference potential used for the amplifying stages.

A plurality of temperature characteristic compensating circuits, which respectively constitute current mirror circuits, are provided for the respective amplifying stages (Tr1, Tr2 and Tr3). The temperature characteristic compensating circuits respectively comprise transistors Tr4, Tr5 and Tr6 (Tr13, Tr14 and Tr15 in the amplifying system b) whose gate and drain electrodes are connected to one another.

A first gate electrode of the transistor Tr1 (TR10 in the amplifying system b) and a first gate electrode of a transistor Tr4 (Tr13 in the amplifying system b) are connected to each other. The first gate electrode of the transistor Tr1 (TR10 in the amplifying system b) is connected to the Vcgs-GSM900 (Vcgs-GSM1800 in the amplifying system b). A second gate electrode of the Tr1 (TR10) is connected to the Pin-GSM900 (Pin-GSM1800 in the amplifying system b) used as an input terminal.

The second gate electrode of the Tr1 and the drain electrode of the load-side transistor of the Tr4 are connected to each other through a resistor R2. The Vapc-GSM900 (Vapc-GSM1800) and a second gate electrode of the Tr4 (Tr13) are connected to each other through a resistor R3 (resistor R16) and a resistor R4 (resistor R17) constituting a voltage dividing resistor. A wiring portion lying between the resistor R3 (resistor R16) and the resistor R4 (resistor R17) is connected to its corresponding drain electrode of the load-side transistor of the Tr4 (Tr13). The resistor R3 (resistor R16) and resistor R4 (resistor R17) constitute a bias circuit.

The second gate electrode of the Tr4 (Tr13) and its corresponding drain electrode of a transistor Tr7 for the selector switch are connected to each other. A source electrode of the transistor Tr7 is grounded. A gate electrode of the transistor Tr7 is connected to a mode switch terminal (mode-SW) through a resistor R5 (resistor R18).

While the second stage is different from the first stage in terms of the dual mode MOSFET and the single gate MOSFET, the second stage is provided with a transistor Tr8 (Tr17) for the selector switch, whose gate electrode is connected to its corresponding mode switch terminal. A source electrode of the transistor Tr8 (Tr17) is grounded, and a drain electrode thereof is connected to its corresponding gate electrode of the Tr5 (Tr14) constituting a current mirror circuit.

A drain electrode of the Tr5 (Tr14) is connected to its corresponding gate electrode of the Tr2 (TR11).

The Vapc-GSM900 (Vapc-GSM1800) and the gate electrode of the Tr5 (Tr14) are connected to each other with a resistor R7 (R20) and a resistor R6 (resistor R19) constituting a voltage dividing resistor being interposed therebetween. A wiring portion lying between the resistor R7 (resistor R20) and the resistor R6 (resistor R19) is connected to its corresponding drain electrode of the Tr5 (Tr14). The resistor R7 (R20) and resistor R6 (resistor R19) constitute a bias circuit.

The third stage is provided with a transistor Tr9 (Tr18) for the selector switch, whose gate electrode is connected to its corresponding mode switch terminal. A source electrode of the transistor Tr9 (Tr18) is grounded, and a drain electrode thereof is connected to its corresponding gate electrode of the Tr6 (Tr15) constituting a current mirror circuit.

A drain electrode of the Tr6 (T15) is connected to its corresponding gate electrode of the Tr3 (Tr12) through a resistor R13 (R26).

The Vapc-GSM900 (Vapc-GSM1800) and the gate electrode of the Tr6 (Tr15) are connected to each other with a resistor R10 (R23) and a resistor R11 (resistor R24) constituting a voltage dividing resistor being interposed therebetween. A wiring portion lying between the resistor R10 (resistor R23) and the resistor R11 (resistor R24) is connected to its corresponding drain electrode of the Tr6 (Tr15). The resistor R10 (R23) and resistor R11 (resistor R24) constitute a bias circuit.

The load-side transistor of the Tr1 (TR10) and the drain electrodes of the Tr2 (TR11) and Tr3 (Tr12) are respectively connected to the Vdd-GSM900 (Vdd-GSM1800) so as to be supplied with a first reference potential (Vdd). The Tr7, Tr8 and Tr9 (Tr16, Tr17 and Tr18) constitute a mode switching circuit. Incidentally, L1 through L14 in the circuit diagram indicate impedance matching circuits respectively.

Figure 7:
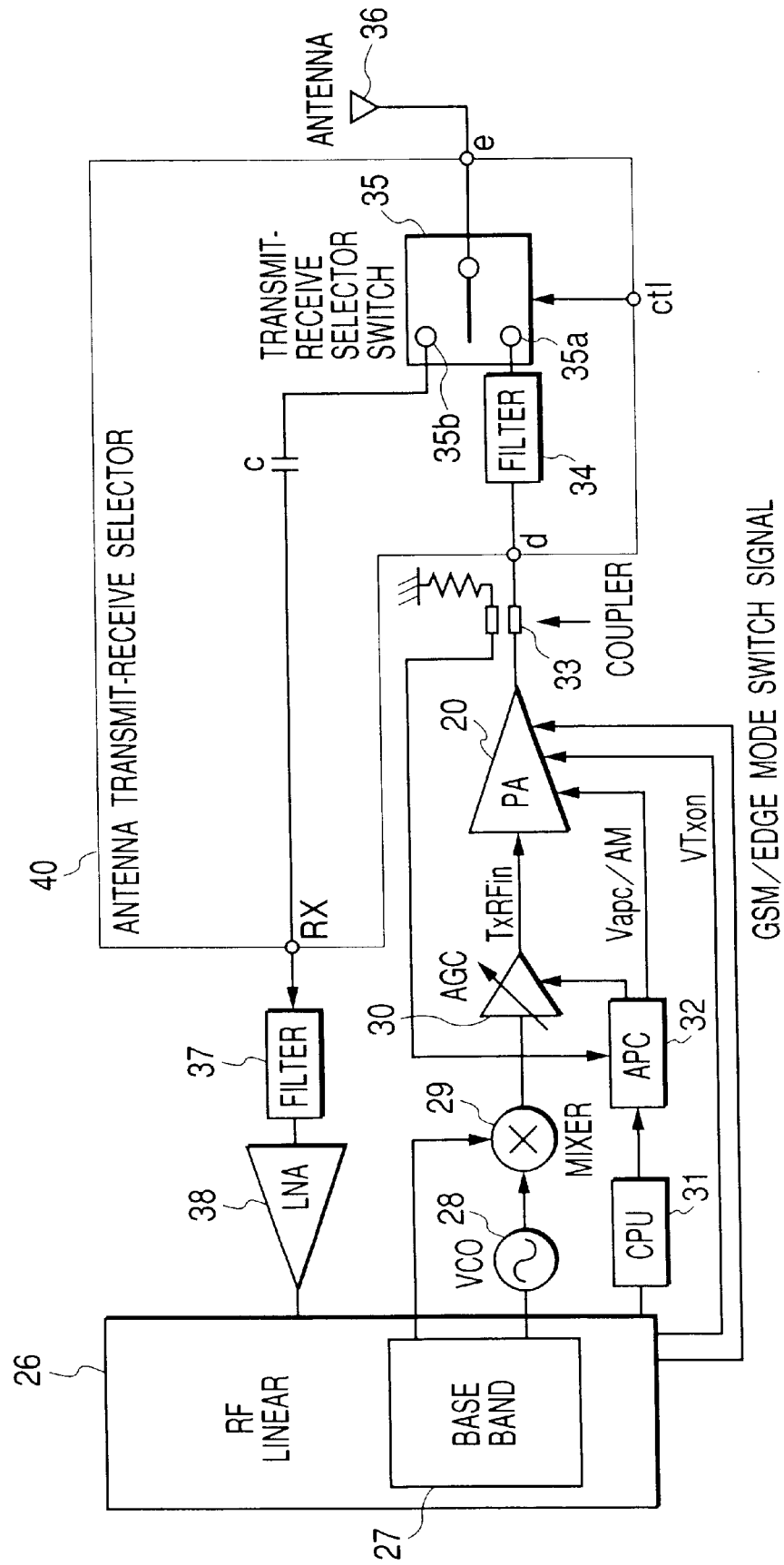
FIG. 7 is a partly block diagram showing a function configuration of a wireless communication apparatus in which the high frequency power amplifier module showing the first embodiment is built.

Such a high frequency power amplifier module illustrated by the equivalent circuit shown in FIG. 6 is built in and used in a wireless communication apparatus as shown in FIG. 7. FIG. 7 is a block diagram showing a part of the wireless communication apparatus and illustrates portions from a high-frequency signal processing IC (RF linear) 26 to an antenna (Antenna) 36.

The antenna 36 is connected to an antenna terminal e of an antenna transmit-receive selector 40. The antenna terminal e and a transmit-receive selector switch 35 are electrically connected to each other. The transmit-receive selector switch 35 is operated according to a switch signal supplied to a control terminal ct1 to thereby change a switch to either an a terminal 35a or a b terminal 35b. A circuit system coupled to the a terminal 35a constitutes a transmission-system circuit, and a circuit system connected to the b terminal 35b constitutes a reception-system circuit. Namely, a capacitor C is interposed between a receiving terminal RX of the antenna transmit-receive selector 40 and the b terminal 35b. Further, a filter 37 and a low noise amplifier (LNA) 38 are successively connected between the receiving terminal RX and the high frequency signal processing IC 26.

The aforementioned high frequency power amplifier module (PA) 20 is provided in the transmission-system circuit. A signal sent from a base band 27 of the high frequency signal processing IC 26 is inputted to the high frequency power amplifier module 20 through a voltage-controlled oscillator (VCO) 28, a mixer 29, and an automatic gain control circuit (AGC circuit) 30. The output of the high frequency power amplifier module 20 is outputted to an input terminal d of the antenna transmit-receive selector 40. The antenna transmit-receive selector 40 is provided with a filter 34 for filtering a signal outputted from the high frequency power amplifier module 20. The signal transmitted through the filter 34 is sent to the a terminal 35a of the transmit-receive selector switch 35.

The high frequency power amplifier module 20 is controlled by an automatic power controller (APC circuit) 32. The APC circuit 32 is controlled by a CPU 31 operated based on a signal sent out from the high frequency signal processing IC 26. A variation in the output of the high frequency power amplifier module 20 is detected by a coupler 33. The detected value is fed back to the APC circuit 32. The APC circuit 32 sends a control signal to each of the AGC circuit 30 and the high frequency power amplifier module 20. The APC circuit 32 transmits a Vapc/AM signal to the high frequency power amplifier module 20. Further, the high frequency signal processing IC 26 sends a VTXon signal and a GSM/EDGE mode switching signal to the high frequency power amplifier module 20.

An RF signal sent from the base band 27 is amplified and controlled by the APC circuit 32, followed by transmission to the antenna 36 according to the switching operation of the transmit-receive selector switch 35. A signal received by the antenna 36 is transmitted through the receiving terminal RX according to the switching operation of the transmit-receive selector switch 35, followed by transmission to the high frequency signal processing IC 26 through the filter 37 and the LNA 38.

In the wiring communication apparatus according to the first embodiment, the dualband configurations of the GSM900 and GSM1800 are adopted and the respective bands are switched over to a GSM system and an EDGE system according to on/off operations of the mode switching transistors to thereby allow wireless communications (GSM900, GSM1800, EDGE900 and EDGE1800) corresponding to four forms.

Figure 8:
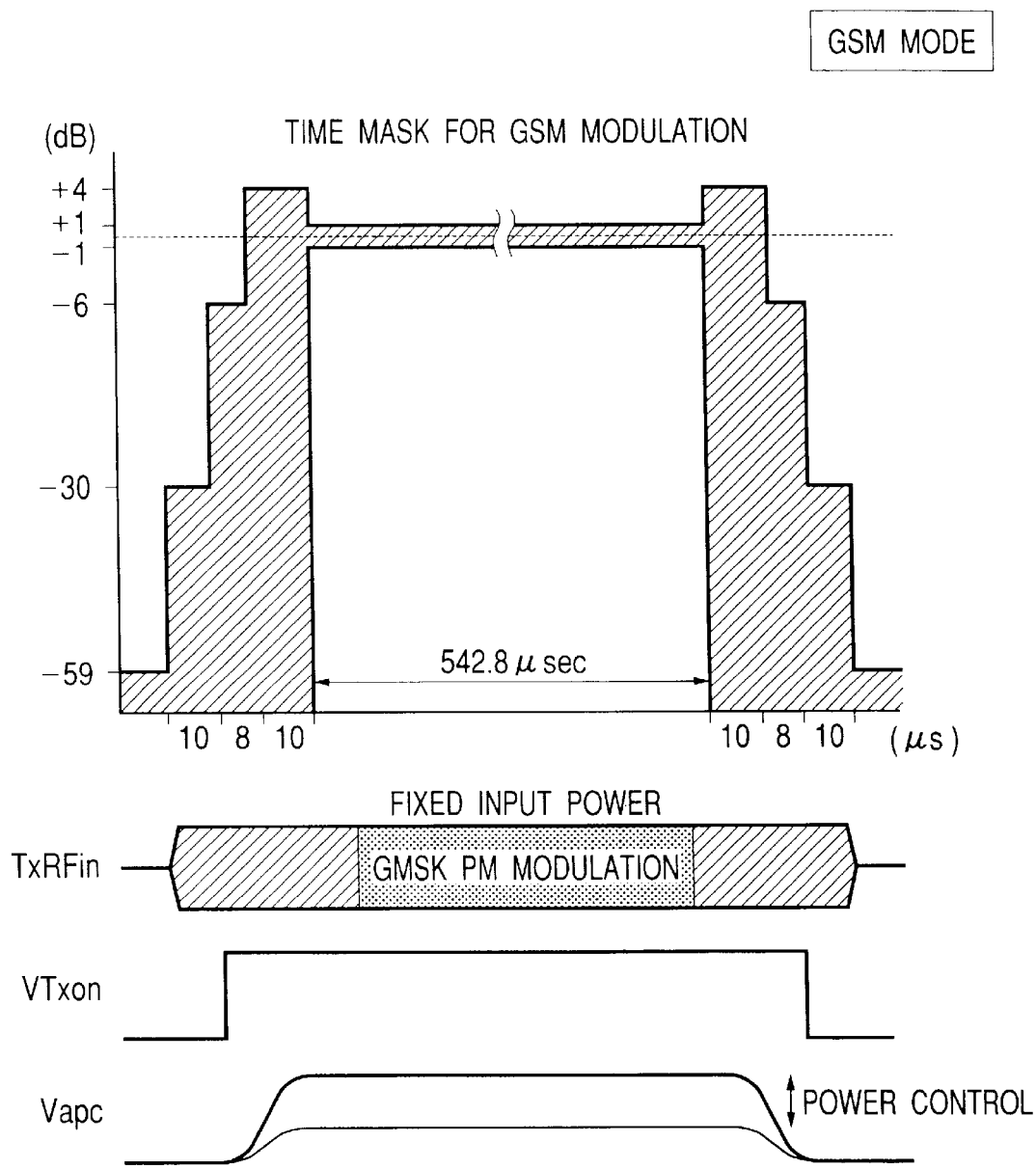
FIG. 8 is a typical diagram illustrating a time mask for a GMS mode of a dual-band high frequency power amplifier module.
Figure 9:
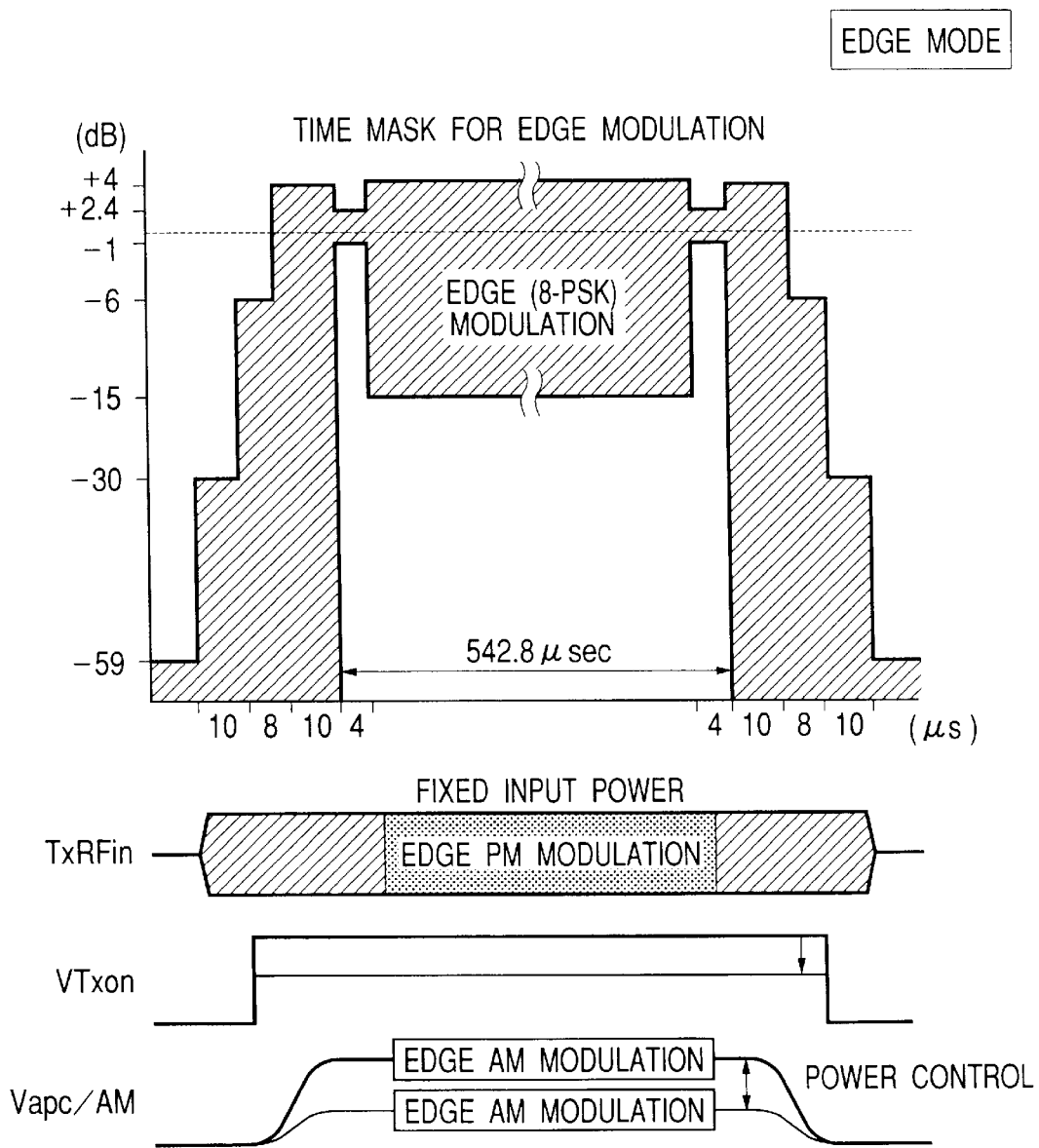
FIG. 9 is a typical diagram depicting a time mask for an EDGE mode of the dual-band high frequency power amplifier module.

In a GSM mode (GSM MODE) and an EDGE mode (EDGE MODE), such time masks as shown in FIGS. 8 and 9 are used upon modulation. FIG. 8 shows the time mask for the conventional GSM modulation system or scheme and illustrates the action of signals on the high frequency power amplifier module (power amp) incidental on it. When a handset is in an operating state, predetermined input power (Pin) having a phase-modulated signal of GMSK is inputted to the power amp. When the VTXon signal indicating of "Transmit it from the RF linear controller including the base band" is sent to the power amp, the power amp is brought to a standby state [corresponding to a state of being capable of varying output power (Pout) by the Vapc voltage] correspondingly. Thus, Pout of the power amp is power-controlled under Vapc voltage control according to the designation or instruction of a power class from a base station.

It is necessary to cause power to rise and fall within the time mask (colored portion) shown in each drawing in the case of a GSM mode-one slot under this series of operations. In fact, GMSK modulation (phase modulation) having a phase information signal is carried out in a state in which power is constant in a certain class.

On the other hand, since an AM component is contained in GMSK phase modulation (PM) as a plus in the case of an EDGE modulation scheme, it is necessary to carry out modulation including AM/PM components of 8-PSK as shown in FIG. 9. Namely, as different from upon the GSM mode, signal's linear amplification is required. Thus, the power amp is set to a standby state according to the VTXon signal (in this case, bias application capable of ensuring linearity is carried out) and AM modulation of EDGE is carried out under the Vapc voltage control in a manner similar to the power class control. This corresponds to the function which has been carried out by an AGC preamplifier in a state in which the Vapc voltage is fixed, in the conventional system. Incidentally, the present mode is identical to the GSM mode in that the designation of the time mask by one slot is carried out and modulation is made with the power class as a given constant state.

Three operation examples will next be described. In these three operation examples, as shown in Table of FIG. 17, the GSM mode is identical in any of the operation examples but the EDGE mode is different therein as in the case of an EDGE mode 1, an EDGE mode 2, and an EDGE mode 3.

Operation Example 1

In the operation example 1, the high frequency power amplifier module (power amp) 20 is used in a state shown in the block diagram of FIG. 7. As to bias configurations as shown in FIG. 17, Vcgs, Vgs1, Vgs2 and Vgs3, and Pin are respectively used in an APC state, an APC or fixed state, an APC state, and a fixed state in the GSM mode. Accordingly, it is not necessary to control the input signal sent to the power amp by AGC in the case of the GSM mode.

The EDGE mode 1 is adopted as the EDGE mode. In the EDGE mode 1, a desired potential is selected and fixed as Vcgs. Further, the Vgs1, Vgs2 and Vgs3 are fixed. The input signal Pin to be sent to the power amp is controlled by AGC.

Incidentally, bias configurations of a circuit discussed in advance of the present invention are represented as shown in FIG. 17. In a GSM mode, Vcgs, Vgs1, Vgs2 and Vgs3 are used as APC, and Pin is used in a fixed state. Accordingly, AGC control becomes unnecessary. In an EDGE mode, Vcgs, Vgs1, Vgs2 and Vgs3 are fixed, and Pin is AGC-controlled.

In the GSM mode in the operation example 1, Vgs1 is used as APC or fixed. However, it has the following features when Vgs1 is fixed.

When Vgs1 is fixed, the impedance as viewed from the input (Pin) is stabilized. An advantage is brought about in that when the APC voltage is gradually reduced and Pout is reduced to about 1 mW, the linearity of a first-stage FET can be maintained.

Such a use form will be explained. A GSM900 mode needs to automatically power-control (APC) Vgs1, Vgs2 and Vgs3 of individual stages according to desired power classes. (1) mode-SW is set to a voltage (High) which ranges from about 2V to about 2.5V.

(2) Since the gate biases of the Tr7, Tr8 and Tr9 become higher than a threshold voltage (Vth) owing to the above (1), currents respectively flow between the drains and sources of the respective Tr7, Tr8 and Tr9, so that the resistors R4, R6 and R11 are respectively brought to states of being grounded to GND for the sources of the Tr7, Tr8 and Tr9. Since, at this time, the second gate electrode of the Tr4 and the gate biases of the Tr5 and Tr6 are respectively taken as a potential lower than the threshold voltage according to the turning ON of the Tr7, Tr8 and Tr9, currents little flow in the current mirror circuits. Thus, Vgs (Vgs1, Vgs2 and Vgs3) of the respective amplifying stages can be set based on respective voltage-division resistance ratios of R3 to R4, R7 to R6 and R10 to R11.

(3) When Vgs (Vgs1, Vgs2 and Vgs3) voltages of the Tr1, Tr2 and Tr3 are varied from Vapc-GSM900 in the state of (2), their bias operations at GSM (saturated mode) are allowed. Incidentally, the respective resistance ratios are set so that the bias value common to Vapc-GSM900 is supplied to Vcgs-GSM900.

(4) On the other hand, when an EDGE mode (EDGE900) is used, mode-SW is switched to a voltage (Low) which ranges from 0V to about 0.3V.

(5) Since the gate biases of the Tr7, Tr8 and Tr9 are respectively lower than the threshold voltage (Vth) according to the above (4), the Tr7, Tr8 and Tr9 sides of R4, R6 and R11 respectively result in an OPEN state. Thus, Vgs (Vgs1, Vgs2 and Vgs3) of the respective amplifying stages can respectively be supplied with predetermined biases made up in temperature characteristic, based on a bias circuit comprising a current mirror circuit comprised of R3 and R4+Tr4, a current mirror circuit comprised of R7 and R6+Tr5, and a current mirror circuit comprised of R10 and R11+Tr6. Namely, it is possible to supply an idle current that has compensated for the temperature characteristic necessary for the linear amp.

(6) At this time, the potential of the bias Vcgs-GSM900 on the control gate side is varied so that the voltage applied to the drain of the load-side transistor of the first-stage transistor Tr1 can be changed. Therefore, a waveform produced from the first-stage transistor Tr1 is not distorted larger. Thus the gain of the amplifier can be varied as shown in FIGS. 10 and 11 in a state in which the linear operation of EDGE, i.e., the spec of ACPR (adjacent channel leakage power) is met.

Figure 10:
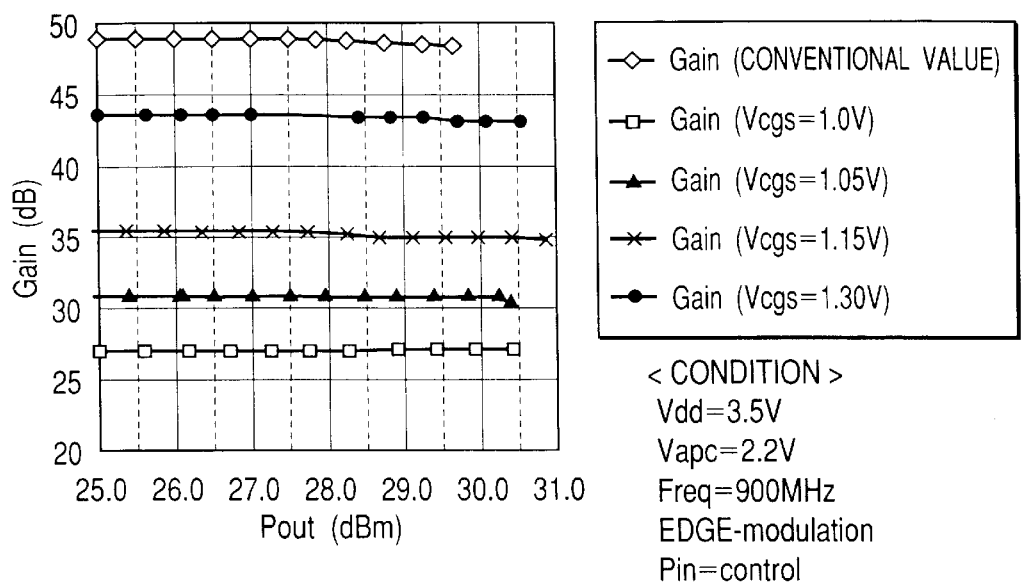
FIG. 10 is a graph showing the correlation between EDGE output power and EDGEGain obtained in an operation example 1 of the high frequency power amplifier module showing the first embodiment.

FIG. 10 is a graph showing the correlation between EDGE output power and EDGEGain. The same graph shows the differences in Gain where Vcgs are varied between the conventional example and the present operation example 1 with respect to Gain (Vcgs=1.0V, Vcgs=1.05V, Vcgs=1.15V, and Vcgs=1.30V). Potentials applied and supplied to their corresponding terminals in this case, i.e., Vdd=3.5V and Vapc=2.2V, the frequency=90 MHz, and Pin=control potential. Thus, the Gain of the EDGE can be varied according to potential control on Vcgs.

Figure 11:
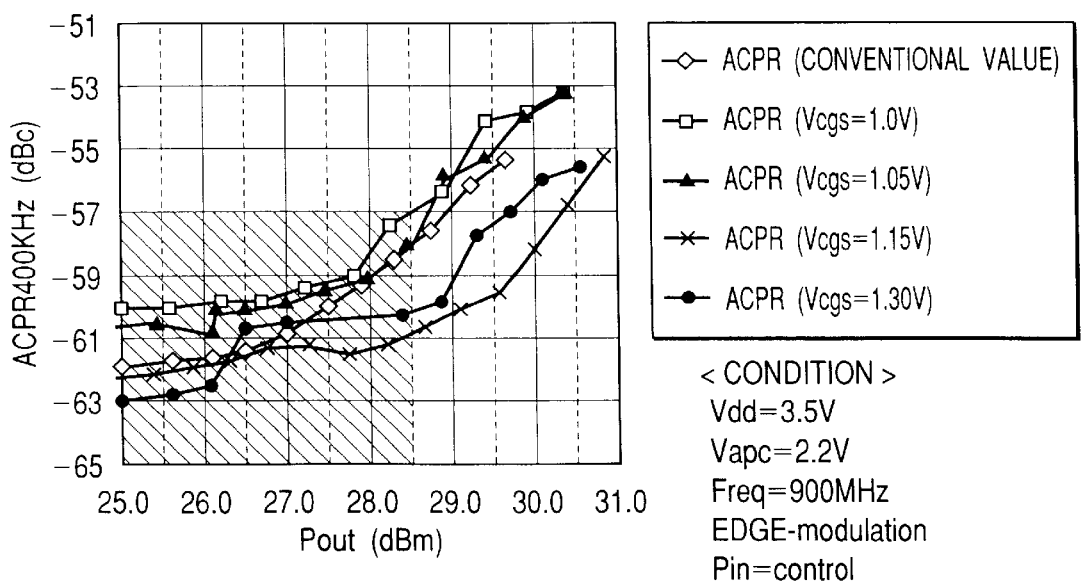
FIG. 11 is a graph illustrating the correlation between EDGE output power and adjacent channel leakage power (ACPR) obtained in the operation example 1.

FIG. 11 is a graph showing the correlation between EDGE output power and adjacent channel leakage power [ACPR: 400 KHz (dBc)]. A region (colored region) in which ACPR is smaller than −57 dBc and Pout is lower than 28.5 dBm, is equivalent to a spec-satisfied range.

The present operation example is an example in which the input power (Pin) is varied on condition that the bias is constant. A gain of 20 dB or more can be reduced as compared with the initial state in which a Vcgs bias value is set identical upon the GSM operation.

In the operation example 1 in this way, the bias circuit including the control gate of the first-stage dual gate MOSFET is used upon the use of the EDGE mode, and the bias circuits taking advantage of the current mirror circuits or the like are switched over according to the GSM and EDGE modes respectively, whereby the EDGE gain can be reduced prior to and subsequent to 35 dB of a target under a three-stage configuration of the same chain as GSM. It is therefore possible to realize the amplification of the EDGE mode on a cellular phone actual device with gain of such an extent that no bad influence is exerted on noise or controllability.

Operation Example 2

Figure 12:
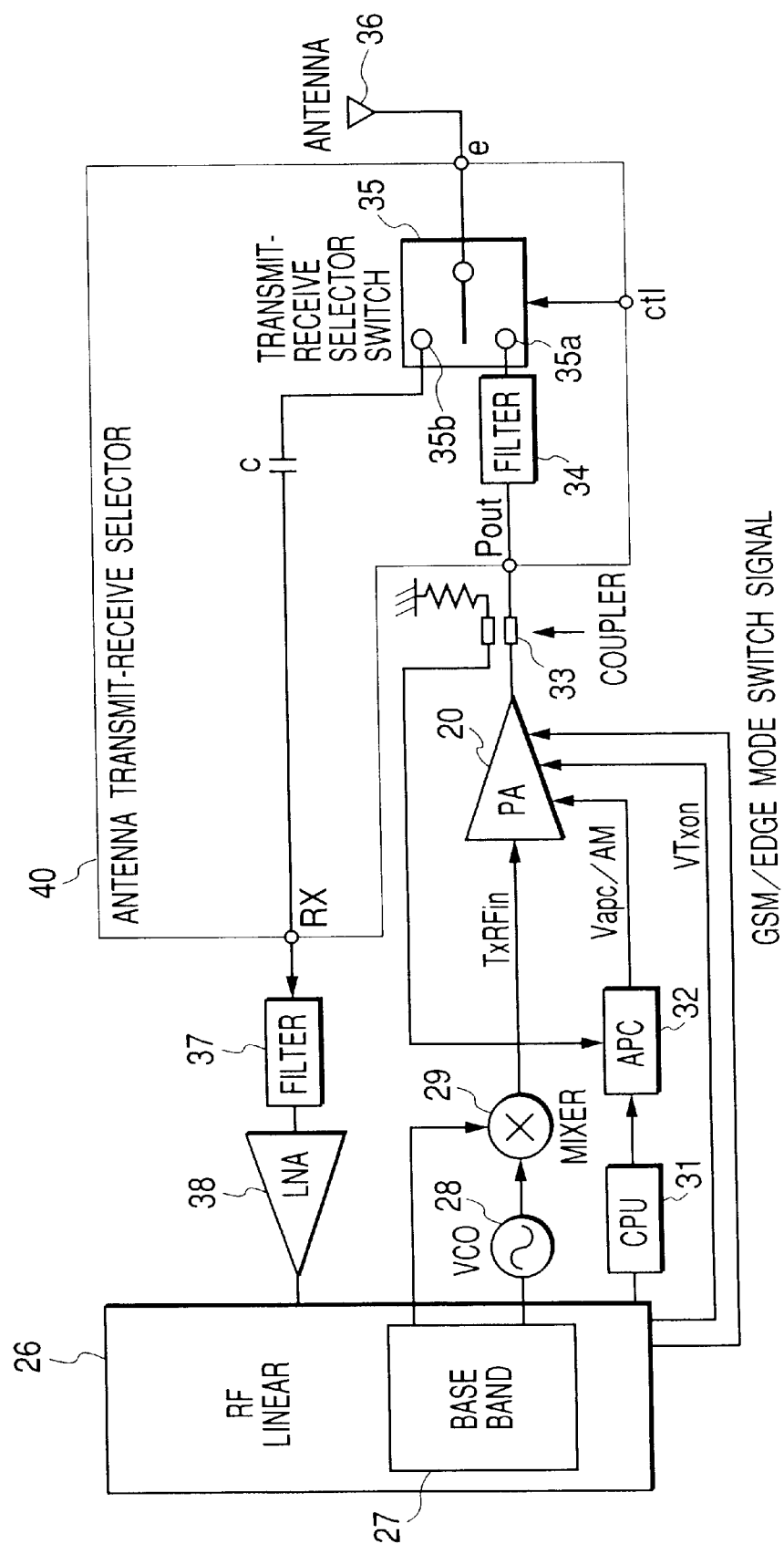
FIG. 12 is a partly block diagram showing a function configuration of a wireless communication apparatus in which the high frequency power amplifier module showing the first embodiment is built.

An another operation example will next be explained. In the present operation example, a function configuration of a wireless communication apparatus is represented as shown in FIG. 12. Namely, while the input power to be sent to the power amp is controlled by the AGC circuit as shown in FIG. 7 in the operation example 1, input power is inputted directly to a power amp 20 from a mixer 29 in the operation example 2 as shown in FIG. 12.

In the operation example 2, the EDGE mode results in the EDGE mode 2 as shown in FIG. 17. In the EDGE mode 2, Vcgs is taken as APC, and Vgs1, Vgs2, Vgs3 and Pin are respectively used in a fixed state. Accordingly, the AGC control becomes unnecessary.

Namely, the EDGE mode 2 in the operation example 2 is one wherein EDGE input power (Pin) is set constant, Vapc is fixed to a given bias value (Vapc=2.2V herein), and EDGE power is controlled by Vcgs alone.

Figure 13:
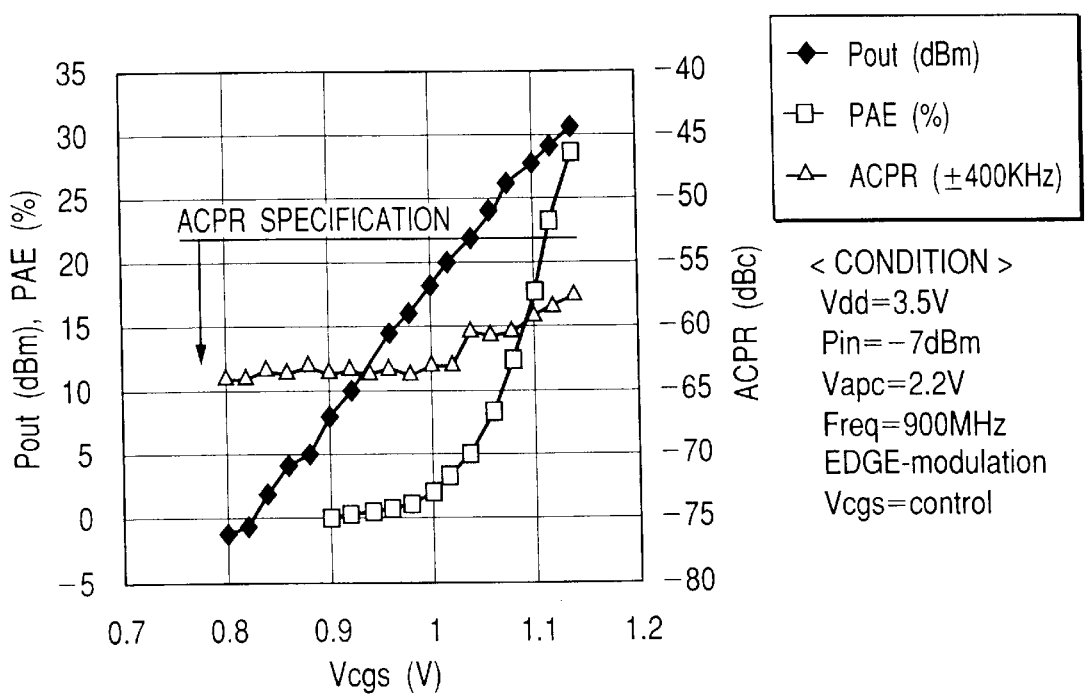
FIG. 13 is a graph illustrating the correlation between output power and power amplifier efficiency (PAE) employed in an operation example 2 of the high frequency power amplifier module illustrating the first embodiment and Vcgs of a first-stage dual gate.

FIG. 13 is a graph showing the correlation between output power and power amp efficiency (PAE) in the EDGE mode 2, and Vcgs of the first-stage dual gate. It is understood that as is apparent from this graph, power control can be realized in a state in which ACPR is held at −57 dBc or less of a target. Namely, the AGC circuit which has heretofore been essential for the linear amp, becomes unnecessary. In a manner similar to upon the GSM operation, an APC voltage (Vcgs herein) can be power-controlled in a state in which the input power is constant.

At this time, the input/output isolation of the amp at power OFF can be ensured by additionally turning ON/OFF Vapc at 0V and 2.2V in the form including the time mask of Vcgs through the use of the VTXon signal.

Figure 18A:
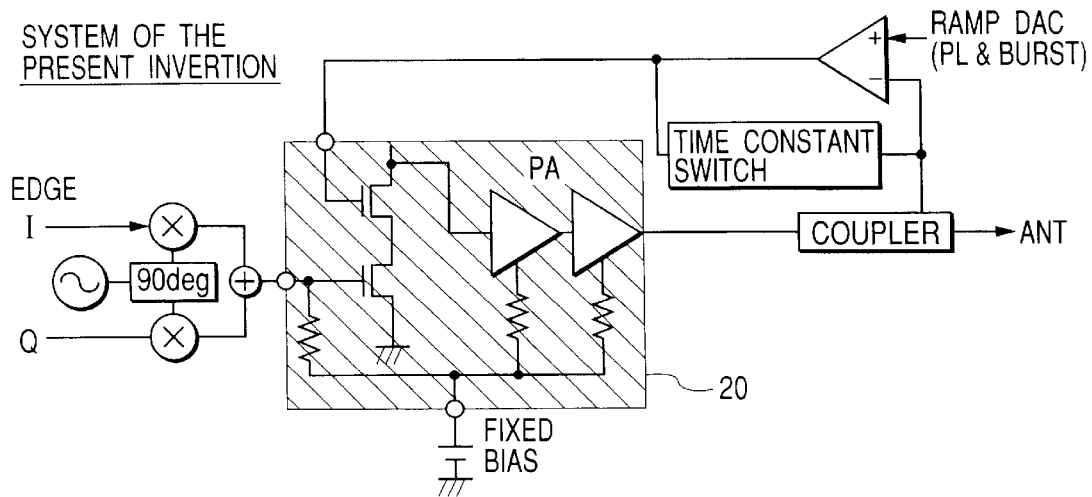
FIG. 18(a) is a block diagram showing the present invention system with the high frequency power amplifier module of the first embodiment built therein and a conventional system with an AGC circuit built therein under a direct conversion method.
Figure 18B:
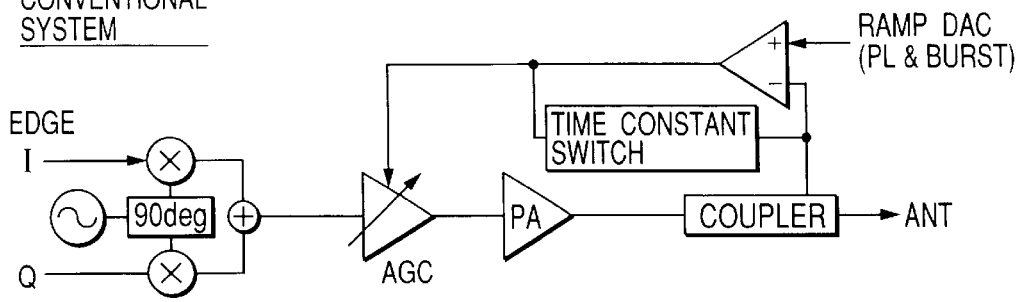
FIG. 18(b) is a known system with the high frequency power amplfier
Figure 19A:
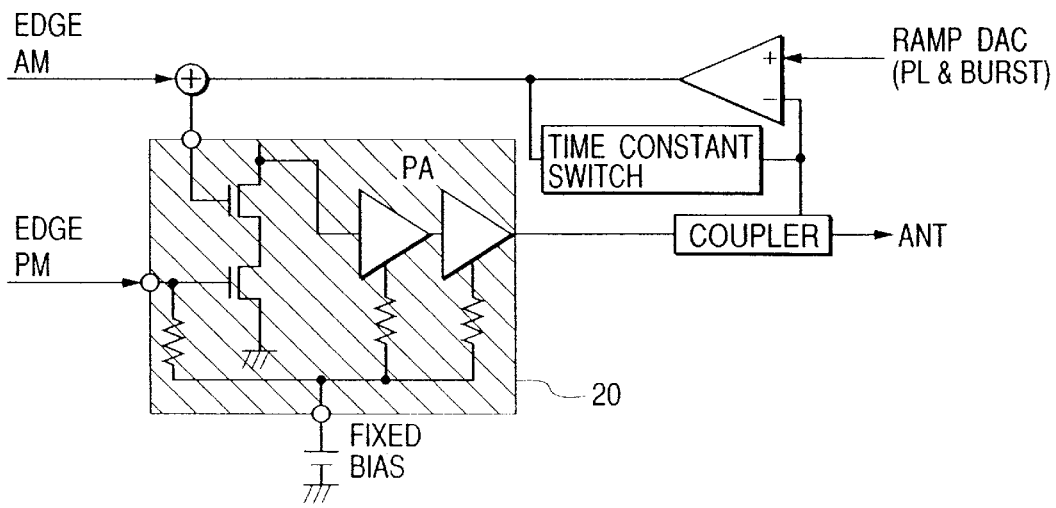
FIG. 19(a) is a block diagram illustrating the present invention system with the high frequency power amplifier module of the first embodiment built therein and a conventional system with an AGC circuit built therein under an offset PLL method.
Figure 19B:
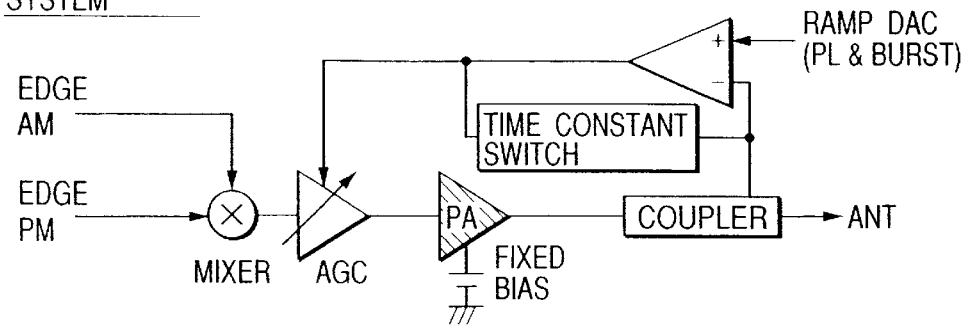
FIG. 19(b) is a known high frequency power amplifier system

In the case of the EDGE mode 2 in the operation example 2, such uses as shown in FIGS. 18 and 19 are enabled. FIG. 18 is a block diagram showing a present invention system in which the high frequency power amplifier module of the first embodiment is built and a conventional or prior art system in which an AGC circuit is built, under a direct conversion system or method. FIG. 19 is a block diagram showing a present invention system in which the high frequency power amplifier module of the first embodiment is built and a conventional or prior art system in which an AGC circuit is built, under an offset PLL system or method.

In the direct conversion method shown in FIG. 18, control for keeping an antenna's output constant is realized by controlling the gain of an AGC amplifier placed in a stage preceding a power amplifier. On the other hand, in the first embodiment, such control is implemented by controlling the control gate voltage of the first-stage dual gate FET lying within the power amplifier without having to use the AGC.

In the prior art system under the offset PLL method shown in FIG. 19, EDGE-modulated AM/PM signal components outputted from a base band are combined together by a mixer. Thereafter, the combined signal is gain-controlled by an AGC amplifier, followed by input to a power amplifier. Control on an antenna's output is carried out by varying the gain of the AGC amplifier placed in a stage preceding the power amplifier.

On the other hand, in the first embodiment, the signal processing and gain control are realized by controlling the control gate voltage of the first-stage dual gate FET lying within the power amplifier. The need for the mixer can also be eliminated as well as the AGC.

Advantages of these methods reside in that such a configuration that AM-modulation and PM-modulation are respectively inputted to the control gate Vcgs and from the input terminal (Pin) in parts upon the EDGE operation, can be facilitated.

Further, both the offset PLL method and the direct conversion method eliminate the need for the AGC circuit. In the offset PLL method, the mixer becomes also unnecessary. Namely, since the linearity based on the AM-amplitude using each Vcgs voltage can be ensured by use of the control gate as described up to now, the present embodiment has the mixer function of combining the PM-modulation from the input and the AM-modulation from Vcgs by means of the first-stage dual gate MOSFET.

Thus, since the AGC circuit or the AGC circuit and the mixer become unnecessary, the number of components of sets placed outside the power amplifier can greatly be reduced, and a reduction in the cost of the wiring communication apparatus can be achieved.

Operation Example 3

Figure 14:
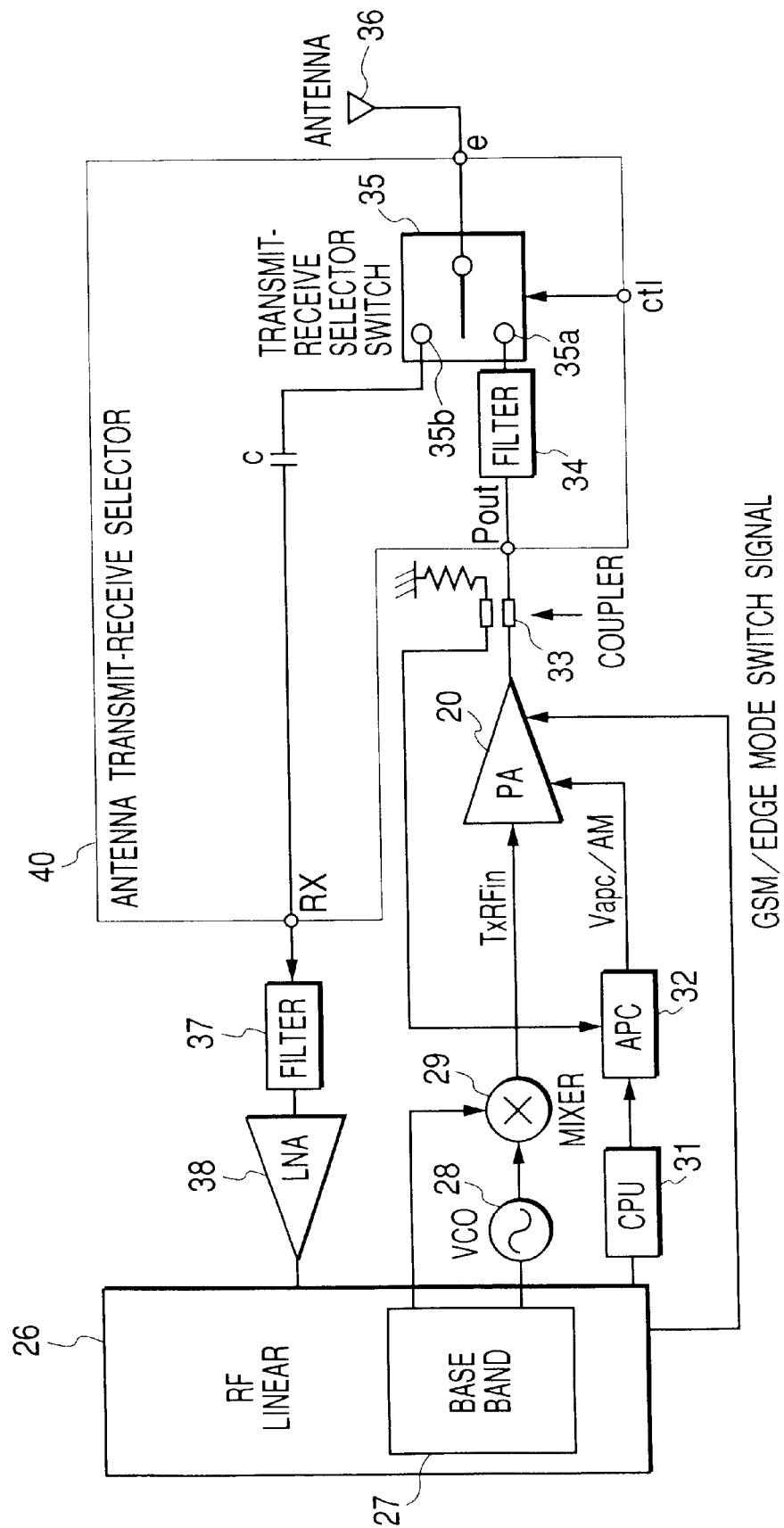
FIG. 14 is a partly block diagram showing a function configuration of a wiring communication apparatus in which the high frequency power amplifier module showing the first embodiment is built.

A further operation example will next be described. In the present operation example, a function configuration of a wiring communication apparatus is represented as shown in FIG. 14. Namely, this indicates the state in which the VTXon signal transmitted from the high frequency signal processing IC 26 to the power amp 20 is omitted from the operation example 2.

In an operation example 3, the EDGE mode is taken as the EDGE mode 3 as shown in FIG. 17. Vcgs, Vgs1, Vgs2 and Vgs3 are used as APC and Pin is used in a fixed state in the EDGE mode 3. Even in this case, the AGC control becomes unnecessary.

Figure 15:
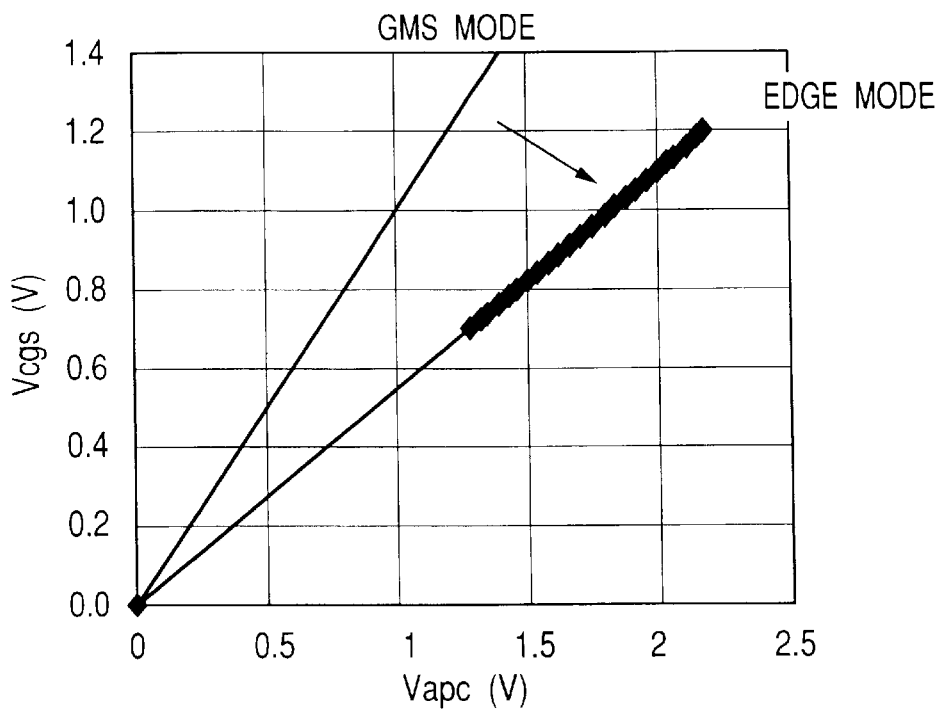
FIG. 15 is a graph illustrating the correlation between Vapc employed in an operation example 3 of the high frequency power amplifier module showing the first embodiment and Vcgs of the first-stage dual gate.
Figure 16:
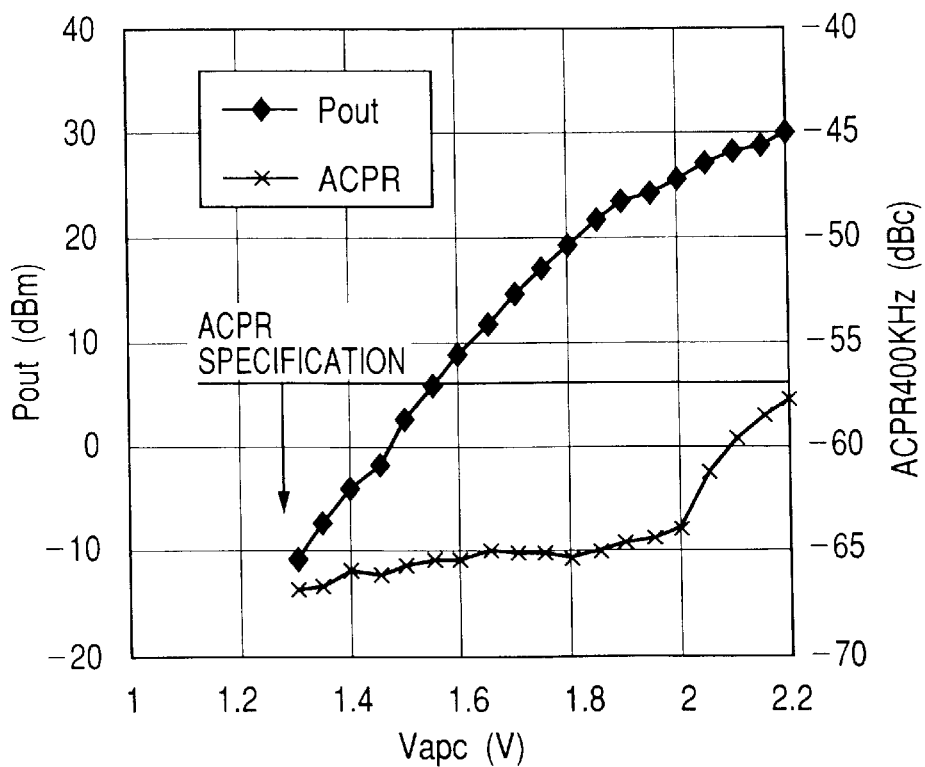
FIG. 16 is a graph showing the correlation between output power and ACPR with respect to Vapc employed in the operation example 3 of the high frequency power amplifier module showing the first embodiment.

Namely, in the EDGE mode 3 in the operation example 3, output power is controlled under voltage control with input power as constant while the correlation between Vapc voltages and Vcgs is being held as a range in which they satisfy linearity (ACPR). The relationships obtained in this state are respectively shown in FIGS. 15 and 16. FIG. 15 is a graph showing the correlation between Vapc employed in the operation example 3 and Vcgs of the first-stage dual gate. FIG. 16 is a graph showing the correlation between output power and ACPR with respect to Vapc employed in the operation example 3.

Since the EDGE operation needs to drive a power stage (final amplifying stage) in a state close to the class A as compared with the case at the GSM operation in the case of the EDGE mode 3, it is necessary to reduce power to be inputted to the power stage. Namely, it is necessary to reduce the value of Vcgs/Vapc as compared with that at the GSM operation. In the EDGE mode 3, an EDGE operation at the time that all gate biases are variable, could be confirmed by holding the correlation of the graph in FIG. 15 while linearity of each amplifying stage is being maintained. As shown in FIG. 16, an ACPR spec is defined as −57 dBc or less.

An advantage of the control method in the EDGE mode 3 resides in that the operating current at the low output can be reduced with respect to the control method (Vapc=fixed) in the EDGE mode 2 employed in the operation example 2, and the input/output isolation of the amp can be ensured because the gate biases of all the transistors are turned OFF at the output OFF.

However, the need to additionally maintain the correlation between the Vapc voltage and Vcgs voltage in the linearity-satisfied range as described above occurs ex integro. It is needless to say that this relationship would vary depending on matching, the type of transistor, bias configurations, etc.

The present embodiment is not limited to or by the aforementioned operation examples. As another operation example, for instance, the transistor corresponding to the second stage of each amplifying system makes use of the dual gate MOSFET, and only Vcgs and Vgs3 corresponding to the third stage may be used for EDGEAPC control.

Second Embodiment

Figure 20:
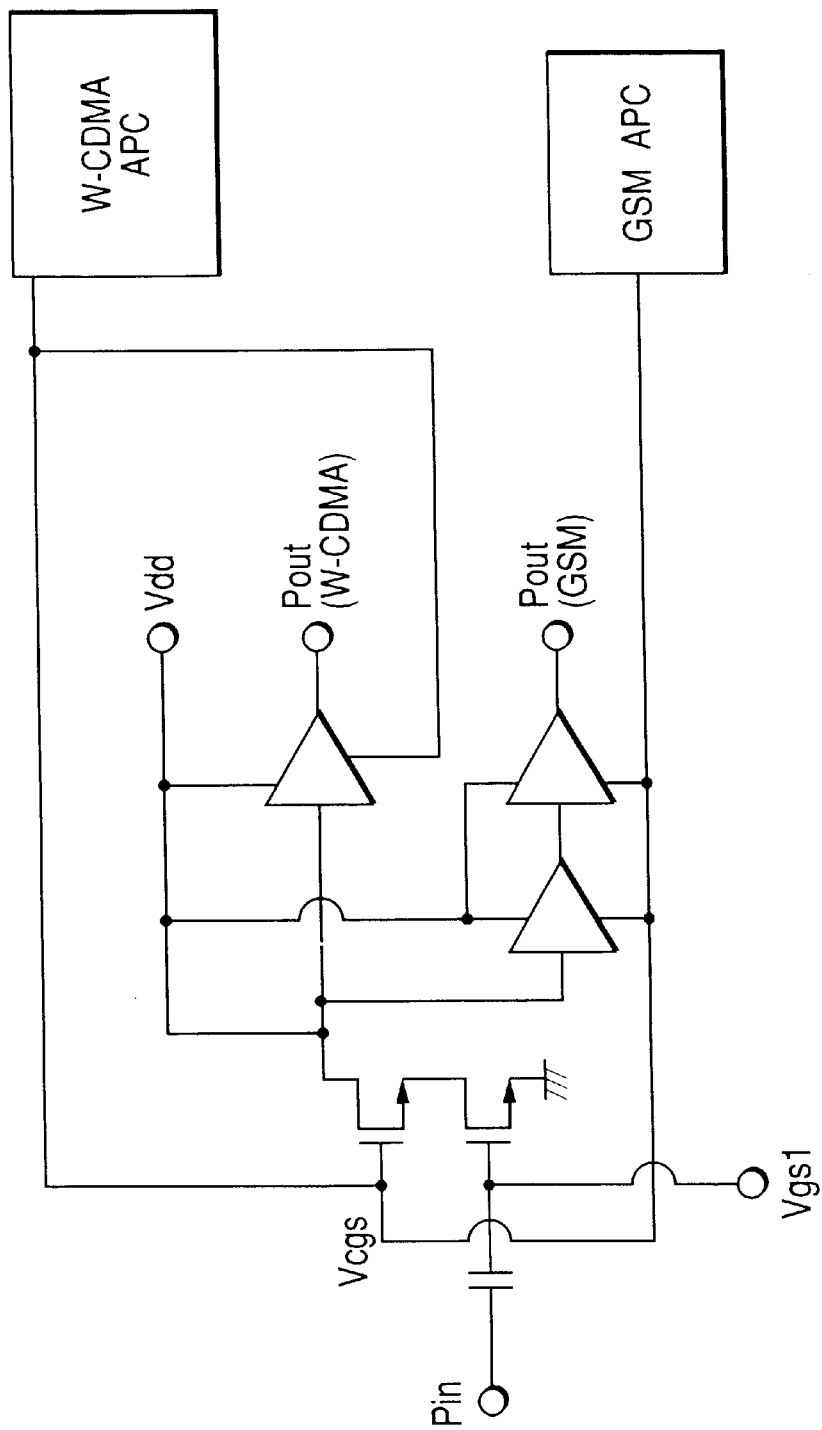
FIG. 20 is a block diagram showing a circuit configuration of a high frequency power amplifier module illustrating another embodiment (second embodiment) of the present invention.

FIG. 20 is a block diagram showing a circuit configuration of a high frequency amplifier module showing another embodiment (second embodiment) of the present invention.

The present embodiment shows a one-input and two-output configuration wherein only a first-stage dual gate MOSFET is used in common and amplifying transistors corresponding to a second stage and subsequent to it are separated. The present example illustrates an example applied to GSM and W (Wideband)-CDMA. The sharing of the initial-stage transistor allows achievement of a size reduction. Incidentally, the first stage may take a two-input and two-output configuration in parts. In this case, it is needless to say that since W-CDMA is linearly operated, the dual gate MOSFET is used as a matter of course.

While the invention made above by the present inventors has been described specifically by the illustrated embodiments, the present invention is not limited to the above embodiments. It is needless to say that various changes can be made thereto within the scope not departing from the substance thereof. For example, amplification for PCS (Personal Communication System) communications and 2 GHz-band digital communications such as W-CDMA intended for multimedia, etc. can also be incorporated into a single high frequency power amplifier module. Other saturation/linear systems such as the AMPS and TDMA, etc. may be used.

Advantageous effects obtained by typical ones of the inventions disclosed in the present application will be explained in brief as follows:

(1) A high frequency power amplifier module and a wireless communication apparatus can be provided or offered which are capable of causing a saturation-operated system and a linearly-operated system to coexist with each other within the same circuit in a noise-generation controlled state.

(2) A high frequency power amplifier module and a wireless communication apparatus can be provided which allow a GSM system (saturation-operated system) and EDGE system (linearly-operated system) to coexist with each other within the same circuit in a noise-generation controlled state.

(3) It is possible to provide a high frequency power amplifier module and a wireless communication apparatus which are capable of restraining or controlling the generation of noise and have plural modes/plural bands configurations.

(4) It is possible to achieve reductions in manufacturing costs of a high frequency power amplifier module and a wireless communication apparatus owing to a reduction in the number of components.

What is claimed is:

1. A high frequency power amplifier module comprising:
   an input terminal supplied with a signal to be amplified;
   an output terminal;
   a control terminal;
   a mode switch terminal;
   a plurality of amplifying stages cascade-connected between said input terminal and said output terminal,
   each said amplifying stage comprising a first terminal which receives a signal inputted to said amplifying stage, a second terminal which transmits a signal outputted therefrom, a third terminal which receives a reference potential for said amplifying stage;
   bias circuits which are respectively connected between said control terminal and the first terminals of said respective amplifying stages and respectively apply to the first terminals a dc bias potential based on a voltage supplied to said control terminal;
   a plurality of temperature characteristic compensating circuits which respectively constitute current mirror circuits with respect to said respective amplifying stages; and
   a mode switching circuit which is operated by a signal supplied to said mode switching terminal and turns on and off each said temperature characteristic compensating circuit to thereby perform switching between communication modes,
   wherein at least one amplifying stage, excluding the amplifying stage corresponding to a final stage of said plurality of amplifying stages, and the corresponding temperature characteristic compensating comprise a respective load-side semiconductor amplifying element a respective and ground-side semiconductor amplifying element connected in series, control terminals of the respective load-side semiconductor amplifying elements thereof are connected to one another, and a control terminal of the said ground-side semiconductor amplifying element of the respective amplifying stage is connected between resistors forming a voltage, divider of the corresponding bias circuit,
   an APC signal is applied to the control terminal of said load-side semiconductor amplifying element of said at least one amplifying stage in one communication mode so that the communication modes different from each other approximate each other in gain, and
   predetermined fixed potentials are respectively applied to the first terminals of said amplifying stages as bias potentials.

2. The high frequency power amplifier module according to claim 1, which is switched to either a phase-modulation circuit configuration or a phase and amplitude-modulation circuit configuration according to the operation of said mode switching circuit.

3. The high frequency power amplifier module according to claim 1, which is switched to either a circuit configuration for a saturation amplifier or a circuit configuration for a linear amplifier according to the operation of said mode switching circuit.

4. The high frequency power amplifier module according to claim 1, which is switched to either a circuit configuration for GSM or a circuit configuration for EDGE according to the operation of said mode switching circuit.

5. The high frequency power amplifier module according to claim 1, wherein said plurality of amplifying stages, and said bias circuits and said temperature characteristic compensating circuits are provided in plural sets to thereby constitute a plurality of amplifying systems, and said respective amplifying stages of said plurality of amplifying systems are connected to said mode switching terminal to constitute a multi-mode and multi-band high frequency power amplifier device.

6. The high frequency power amplifier module according to claim 1, wherein the amplifying stages each corresponding to a first stage, of said plurality of amplifying systems are provided in a shared configuration.

7. The high frequency power amplifier module according to claim 1, wherein said load-side semiconductor amplifying element and said ground-side semiconductor amplifying element connected in series are dual gate type semiconductor amplifying elements.

8. A wireless communication apparatus having a high frequency power amplifier module according to claim 1.

9. The wireless communication apparatus according to claim 8, wherein said high frequency power amplifier module is used in a direct conversion method wherein a quatrature component signal and a synchronous component signal are inputted to an input terminal.

10. The wiring communication apparatus according to claim 8, wherein said high frequency power amplifier module is used in an offset PLL method wherein an amplitude-modulated signal is directly inputted to a first gate of a dual gate transistor of a first-stage amplifying stage and a phase signal is directly inputted to a second gate thereof.

11. A high frequency power amplifier module comprising:
an input terminal supplied with a signal to be amplified;
an output terminal;
a control terminal;
a mode switch terminal;
a plurality of amplifying stages cascade-connected between said input terminal and said output terminal,
each said amplifying stage comprising a first terminal which receives a signal inputted to said amplifying stage, a second terminal which transmits a signal outputted therefrom, and a third terminal which receives a reference potential for said amplifying stage;
bias circuits which are respectively connected between said control terminal and the first terminals of said respective amplifying stages and respectively apply to the first terminals a dc bias potential based on a voltage supplied to said control terminal;
a plurality of temperature characteristic compensating circuits which respectively constitute current mirror circuits with respect to said respective amplifying stages; and
a mode switching circuit which is operated by a signal supplied to said mode switching terminal and turns on and off each temperature characteristic compensating circuit to thereby perform switching between communication modes,
wherein at least one amplifying stage excluding the amplifying stage corresponding to a final stage of said plurality of amplifying stages, and the corresponding temperature characteristic compensating circuit each comprise a respective load-side semiconductor amplifying element and a respective ground-side semiconductor amplifying element connected in series, control terminals of the respective load-side semiconductor amplifying elements thereof are connected to one another, and a control terminal of the ground-side semiconductor amplifying is connected between resistors forming a voltage divider of the corresponding bias circuit,
an APC signal is applied to the control terminal of said load-side semiconductor amplifying element of said at least one amplifying stage in one communication mode so that the communication modes different from each other approximate each other in gain, and
APC signals are respectively applied to the first terminals of said amplifying stages as bias potentials.

12. The high frequency power amplifier module according to claim 11, which is switched to either a phase-modulation circuit configuration or a phase and amplitude-modulation circuit configuration according to the operation of said mode switching circuit.

13. The high frequency power amplifier module according to claim 11, which is switched to either a circuit configuration for a saturation amplifier or a circuit configuration for a linear amplifier according to the operation of said mode switching circuit.

14. The high frequency power amplifier module according to claim 11, which is switched to either a circuit configuration for GSM or a circuit configuration for EDGE according to the operation of said mode switching circuit.

15. The high frequency power amplifier module according to claim 11, wherein said plurality of amplifying stages, and said bias circuits and said temperature characteristic compensating circuits are provided in plural sets to thereby constitute a plurality of amplifying systems, and said respective amplifying stages of said plurality of amplifying systems are connected to said mode switching terminal to constitute a multi-mode and multi-band high frequency power amplifier device.

16. The high frequency power amplifier module according to claim 11, wherein the amplifying stages each corresponding to a first stage, of said plurality of amplifying systems are provided in a shared configuration.

17. The high frequency power amplifier module according to claim 11, wherein said load-side semiconductor amplifying element and said ground-side semiconductor amplifying element connected in series are dual gate type semiconductor amplifying elements.

18. A wireless communication apparatus having a high frequency power amplifier module according to claim 11.

19. A high frequency power amplifier module comprising:
an input terminal supplied with a signal to be amplified;
an output terminal;
a control terminal;
a mode switch terminal;
a plurality of amplifying stages cascade-connected between said input terminal and said output terminal,
each said amplifying stage comprising a first terminal which receives a signal inputted to said amplifying stage, a second terminal which transmits a signal outputted therefrom, and a third terminal which receives a reference potential for said amplifying stage;
bias circuits which are respectively connected between said control terminal and the first terminals of said respective amplifying stages and respectively apply to the first terminals a dc bias potential based on a voltage supplied to said control terminal;

a plurality of temperature characteristic compensating circuits which respectively constitute current mirror circuits with respect to said amplifying stages; and a mode switching circuit which is operated by a signal supplied to said mode switching terminal and turns on and off each said temperature characteristic compensating circuit to thereby perform switching between communication modes, wherein at least one amplifying stage, excluding the amplifying stage corresponding to a final stage of said plurality of amplifying stages, and the corresponding temperature characteristic compensating circuit each comprise a respective load-side semiconductor amplifying elements and ground-side semiconductor amplifying element connected in series, control terminals of the respective load-side semiconductor amplifying elements thereof are connected to one another, and a control terminal of the ground-side semiconductor amplifying element of the respective amplifying stage is connected between resistors forming a voltage divider of the corresponding bias circuits, a selected and fixed potential is applied to the control terminal of said load-side semiconductor amplifying element of said at least one amplifying stage in one communication mode so that the communication modes different from each other approximate each other in gain, and predetermined fixed potentials are respectively applied to the first terminals of said amplifying stages as bias potentials.

20. The high frequency power amplifier module according to claim 19, which is switched to either a phase-modulation circuit configuration or a phase and amplitude-modulation circuit configuration according to the operation of said mode switching circuit.

21. The high frequency power amplifier module according to claim 19, which is switched to either a circuit configuration for a saturation amplifier or a circuit configuration for a linear amplifier according to the operation of said mode switching circuit.

22. The high frequency power amplifier module according to claim 19, which is switched to either a circuit configuration for GSM or a circuit configuration for EDGE according to the operation of said mode switching circuit.

23. The high frequency power amplifier module according to claim 19, wherein said plurality of amplifying stages, and said bias circuits and said temperature characteristic compensating circuits are provided in plural sets to thereby constitute a plurality of amplifying systems, and said respective amplifying stages of said plurality of amplifying systems are connected to said mode switching terminal to constitute a multi-mode and multi-band high frequency power amplifier device.

24. The high frequency power amplifier module according to claim 19, wherein the amplifying stages each corresponding to a first stage, of said plurality of amplifying systems are provided in a shared configuration.

25. The high frequency power amplifier module according to claim 19, wherein said load-side semiconductor amplifying element and said ground-side semiconductor amplifying element connected in series are dual gate type semiconductor amplifying elements.

26. A wireless communication apparatus having a high frequency power amplifier module according to claim 19.

27. A high frequency power amplifier module for performing a linear amplifying operation or a non-linear amplifying operation according to a communication mode signal, comprising:

an input terminal supplied with a signal to be amplified;
an output terminal;
a mode switch terminal;
a plurality of amplifying stages cascade-connected between said input terminal and said output terminal and having first terminals for respectively receiving input signals supplied to said amplifying stages, and second terminals for respectively sending out signals outputted from said amplifying stages;

bias circuits which are respectively connected to the first terminals of said respective amplifying stages and apply bias potentials to the first terminals; and a mode switching circuit which forms a mode signal according to a communication mode signal supplied to said mode switch terminal;

wherein at least one amplifying stage of said plurality of amplifying stages includes first and second semiconductor amplifying elements series-connected to one another between the second terminal of said amplifying stage and a predetermined voltage, the first terminal of said amplifying stage is connected to a control input node of the second semiconductor amplifying element, and the second terminal thereof is connected to an output node of the first semiconductor amplifying element, the mode signal is supplied to the control input node of the first semiconductor amplifying element, and when the linear amplifying operation and the non-linear amplifying operation are performed, gain is controlled by the mode signal.

28. The high frequency power amplifier module according to claim 27, which is operated as a saturation amplifier or a non-saturation amplifier according to the mode signal.

29. The high frequency power amplifier module according to claim 27, which is operated as a GSM amplifier or an EDGE amplifier according to the mode signal.

30. The high frequency power amplifier module according to claim 27, wherein the first and second semiconductor amplifying elements series-connected to each other are of a single dual gate type semiconductor amplifying element.

31. A wireless communication apparatus having a high frequency power amplifier module according to claim 27.

32. A high frequency power amplifier module comprising:
an input terminal supplied with a signal to be amplified;
an output terminal;
a mode terminal;
a plurality of amplifying stages cascade-connected between said input terminal and said output terminal and having first terminals for respectively receiving input signals supplied to said amplifying stages, and second terminals for respectively sending out signals outputted from said amplifying stages;

bias circuits which supply bias potentials to said respective amplifying stages respectively; and a mode circuit which forms an AGC signal according to a signal supplied to said mode terminal;

wherein at least one of said amplifying stages has first and second semiconductor amplifying elements series-connected to one another between the second terminal of said amplifying stage and a predetermined voltage, and a control terminal of the first semiconductor amplifying element is supplied with the AGC signal, an output terminal of the first semiconductor amplifying element is connected to the corresponding second terminal, and a control terminal of the second semiconductor amplifying element is connected to the corresponding first terminal.

33. The high frequency power amplifier module according to claim 32, wherein the first and second semiconductor amplifying elements series-connected to one another are a single dual gate type semiconductor amplifying element.

34. A wireless communication apparatus having a high frequency power amplifier module according to claim 32.

35. A high frequency power amplifier module comprising:

an input terminal supplied with a signal to be amplified;

an output terminal;

a mode terminal;

a plurality of amplifying stages cascade-connected between said input terminal and said output terminal and having first terminals for respectively receiving input signals supplied to said amplifying stages, and second terminals for respectively sending out signals outputted from said amplifying stages;

bias circuits which supply bias potentials to said respective amplifying stages respectively; and a mode circuit which forms an APC signal according to a signal supplied to said mode terminal;

wherein at least one of said amplifying stages has first and second semiconductor amplifying elements series-connected to one another between the second terminal of said amplifying stage and a predetermined voltage, and a control terminal of the first semiconductor amplifying element is supplied with the APC signal, a control terminal of the second semiconductor amplifying element is connected to the corresponding first terminal and an output terminal of the first semiconductor amplifying element is connected to the corresponding second terminal.

36. The high frequency power amplifier module according to claim 35, wherein the first and second semiconductor amplifying elements connected in series are a single dual gate type semiconductor amplifying element.

37. A wireless communication apparatus having a high frequency power amplifier module according to claim 35.

* * * * *